(12) United States Patent
Kasahara et al.

(10) Patent No.: US 7,998,845 B2
(45) Date of Patent: Aug. 16, 2011

(54) SEMICONDUCTOR DEVICE AND METHOD OF MANUFACTURING THE SAME

(75) Inventors: Kenji Kasahara, Tsukuba (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 515 days.

(21) Appl. No.: 11/785,633

(22) Filed: Apr. 19, 2007

(65) Prior Publication Data

US 2007/0196960 A1  Aug. 23, 2007

Related U.S. Application Data

(62) Division of application No. 10/187,414, filed on Jul. 2, 2002, now abandoned.

(30) Foreign Application Priority Data

Jul. 2, 2001 (JP) ................................. 2001-200319

(51) Int. Cl.
*H01L 21/20* (2006.01)
(52) U.S. Cl. ................................ 438/487; 257/E21.134
(58) Field of Classification Search .................. 438/487; 257/E21.134
See application file for complete search history.

(56) References Cited

U.S. PATENT DOCUMENTS

| | | | |
|---|---|---|---|
| 5,621,224 A | 4/1997 | Yamazaki et al. |
| 5,643,826 A | 7/1997 | Ohtani et al. |
| 5,693,541 A | 12/1997 | Yamazaki et al. |
| 5,789,284 A | 8/1998 | Yamazaki et al. |
| 5,795,795 A | 8/1998 | Kousai et al. |
| 5,828,084 A | 10/1998 | Noguchi et al. |
| 5,923,962 A | 7/1999 | Ohtani et al. |
| 5,932,893 A | 8/1999 | Miyanaga et al. |
| 5,943,560 A | 8/1999 | Chang et al. |
| 6,048,758 A | 4/2000 | Yamazaki et al. |
| 6,071,766 A | 6/2000 | Yamazaki et al. |
| 6,093,587 A | 7/2000 | Ohtani |
| 6,107,639 A | 8/2000 | Yamazaki et al. |
| 6,121,660 A | 9/2000 | Yamazaki et al. |
| 6,143,661 A | 11/2000 | Kousai et al. |

(Continued)

FOREIGN PATENT DOCUMENTS

EP  0 884 770  12/1998

(Continued)

OTHER PUBLICATIONS

Office Action dated Jun. 17, 2005, Chinese Patent Office, Application No. 002131506.X.

(Continued)

*Primary Examiner* — W. David Coleman
(74) *Attorney, Agent, or Firm* — Eric J. Robinson; Robinson Intellectual Property Law Office, P.C.

(57) ABSTRACT

To provide a semiconductor device in which a semiconductor film having a leveled main surface is used as an active layer. A semiconductor film (5) having the leveled main surface with an rms of less than 10 nm and a P-V value of less than 70 nm which each indicate a surface roughness is formed by crystallizing a silicon film (3) containing germanium in a concentration of several %, preferably 0.1 to 10 atoms % and irradiating the film with a laser light. In a case of performing a crystallization by use of a metal element for accelerating the crystallization. The semiconductor film high in an orientation rate of the crystal as well as in levelness is obtained.

39 Claims, 15 Drawing Sheets

U.S. PATENT DOCUMENTS

| | | |
|---|---|---|
| 6,160,279 A | 12/2000 | Zhang et al. |
| 6,165,824 A | 12/2000 | Takano et al. |
| 6,281,057 B2 | 8/2001 | Aya et al. |
| 6,331,457 B1 | 12/2001 | Yamazaki et al. |
| 6,388,270 B1 | 5/2002 | Yamazaki et al. |
| 6,399,454 B1 | 6/2002 | Yamazaki |
| 6,433,363 B1 | 8/2002 | Yamazaki et al. |
| 6,444,390 B1 | 9/2002 | Yamazaki et al. |
| 6,444,509 B1 | 9/2002 | Noguchi et al. |
| 6,475,840 B1 | 11/2002 | Miyanaga et al. |
| 6,479,333 B1 | 11/2002 | Takano et al. |
| 6,482,684 B1 | 11/2002 | Yamazaki |
| 6,489,189 B2 | 12/2002 | Yamazaki et al. |
| 6,559,036 B1 | 5/2003 | Ohtani et al. |
| 6,608,326 B1 | 8/2003 | Shinagawa et al. |
| RE38,266 E | 10/2003 | Yamazaki et al. |
| 6,638,797 B2 | 10/2003 | Noguchi et al. |
| 6,677,222 B1 | 1/2004 | Mishima et al. |
| 6,680,223 B1 | 1/2004 | Yamazaki et al. |
| 6,690,068 B2 | 2/2004 | Yamazaki et al. |
| 6,703,265 B2 | 3/2004 | Asami et al. |
| 6,706,568 B2 | 3/2004 | Nakajima |
| 6,759,677 B1 | 7/2004 | Yamazaki et al. |
| 6,764,928 B1 | 7/2004 | Ohtani |
| 6,787,407 B2 | 9/2004 | Nakamura et al. |
| 6,787,807 B2 | 9/2004 | Yamazaki et al. |
| 6,821,827 B2 | 11/2004 | Nakamura et al. |
| 6,828,179 B2 | 12/2004 | Yamazaki et al. |
| 6,828,587 B2 | 12/2004 | Yamazaki et al. |
| 6,855,584 B2 | 2/2005 | Yamazaki et al. |
| 6,924,506 B2 | 8/2005 | Zhang et al. |
| 6,924,528 B2 | 8/2005 | Yamazaki et al. |
| 6,962,837 B2 | 11/2005 | Yamazaki |
| 7,129,120 B2 | 10/2006 | Yamazaki |
| 7,153,729 B1 | 12/2006 | Yamazaki et al. |
| 7,186,600 B2 | 3/2007 | Ohtani et al. |
| 2002/0043660 A1 | 4/2002 | Yamazaki et al. |
| 2003/0071307 A1 | 4/2003 | Noguchi et al. |
| 2003/0160239 A1 | 8/2003 | Shinagawa et al. |
| 2003/0207503 A1 | 11/2003 | Yamazaki et al. |
| 2005/0054181 A1 | 3/2005 | Nakamura et al. |

FOREIGN PATENT DOCUMENTS

| | | |
|---|---|---|
| JP | 07-130652 | 5/1995 |
| JP | 08-078329 | 3/1996 |
| JP | 08-148428 | 6/1996 |
| JP | 08-213316 | 8/1996 |
| JP | 08-255916 | 10/1996 |
| JP | 11-031660 | 2/1999 |
| JP | 11-354442 | 12/1999 |
| JP | 2000-114173 | 4/2000 |
| JP | 2000-114527 | 4/2000 |
| JP | 2000-340503 | 12/2000 |
| JP | 2001-023899 | 1/2001 |
| JP | 2001-035787 | 2/2001 |
| JP | 2001-060551 | 3/2001 |
| JP | 2001-250777 | 9/2001 |
| KR | 96-36149 | 10/1996 |
| KR | 1999-030172 | 4/1999 |

OTHER PUBLICATIONS

Sze, S., "Physics of Semiconductor Devices," John Wiley & Sons, New York 1981, Second Edition, p. 386.

Feller, W., "An Introduction to Probability Theory and its Applications," vol. 1, Third Edition, John Wiley & Sons, New York, 1968, pp. 243-245.

Bozzo, S. et al., "Chemical Vapor Deposition of Silicon-Germanium Heterostructures," Journal of Crystal-Growth, vol. 216, North Holland-Elsevier Publishing Company B.V., 2000, pp. 171-184.

Office Action (Korean Application No. 2002-0037876) dated Sep. 16, 2008.

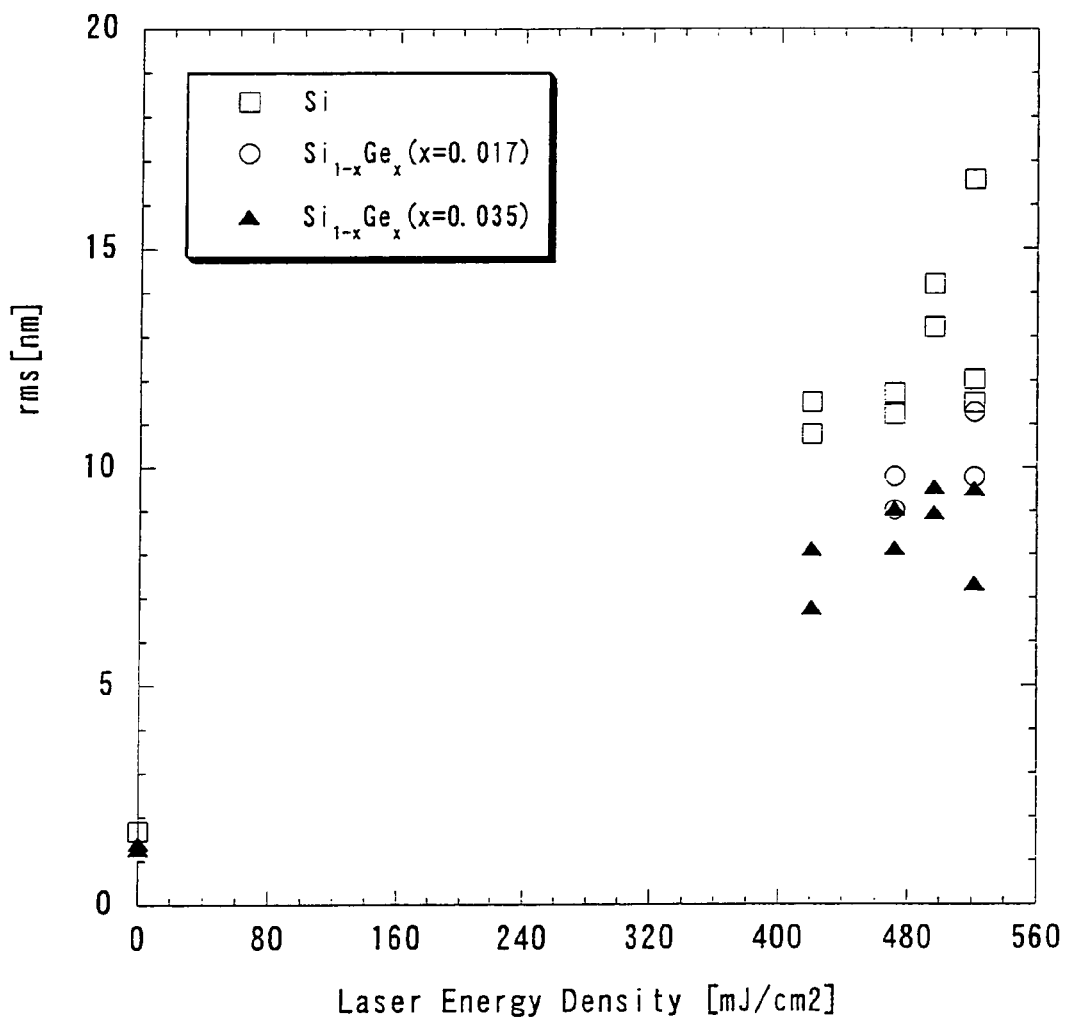
F I G. 2

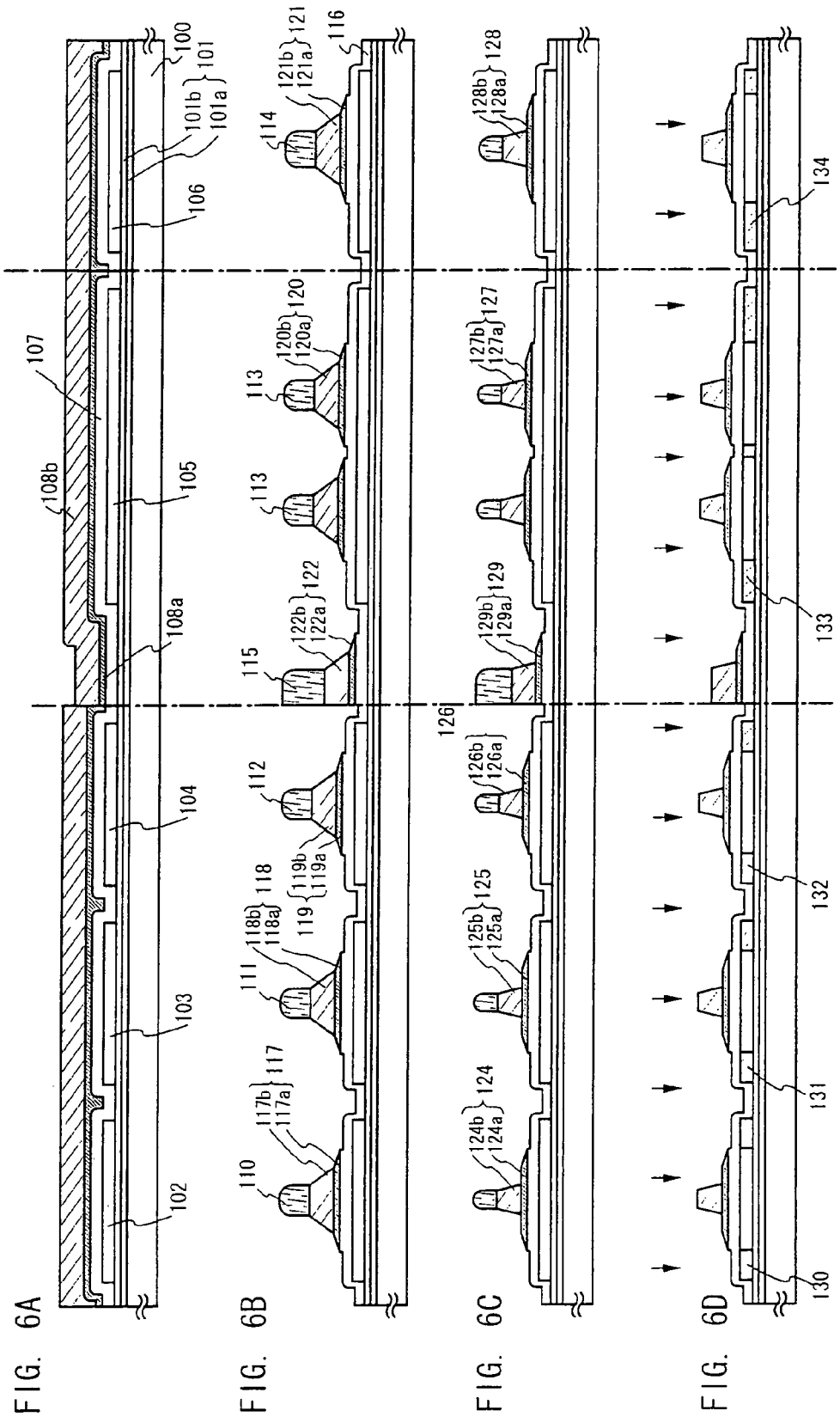

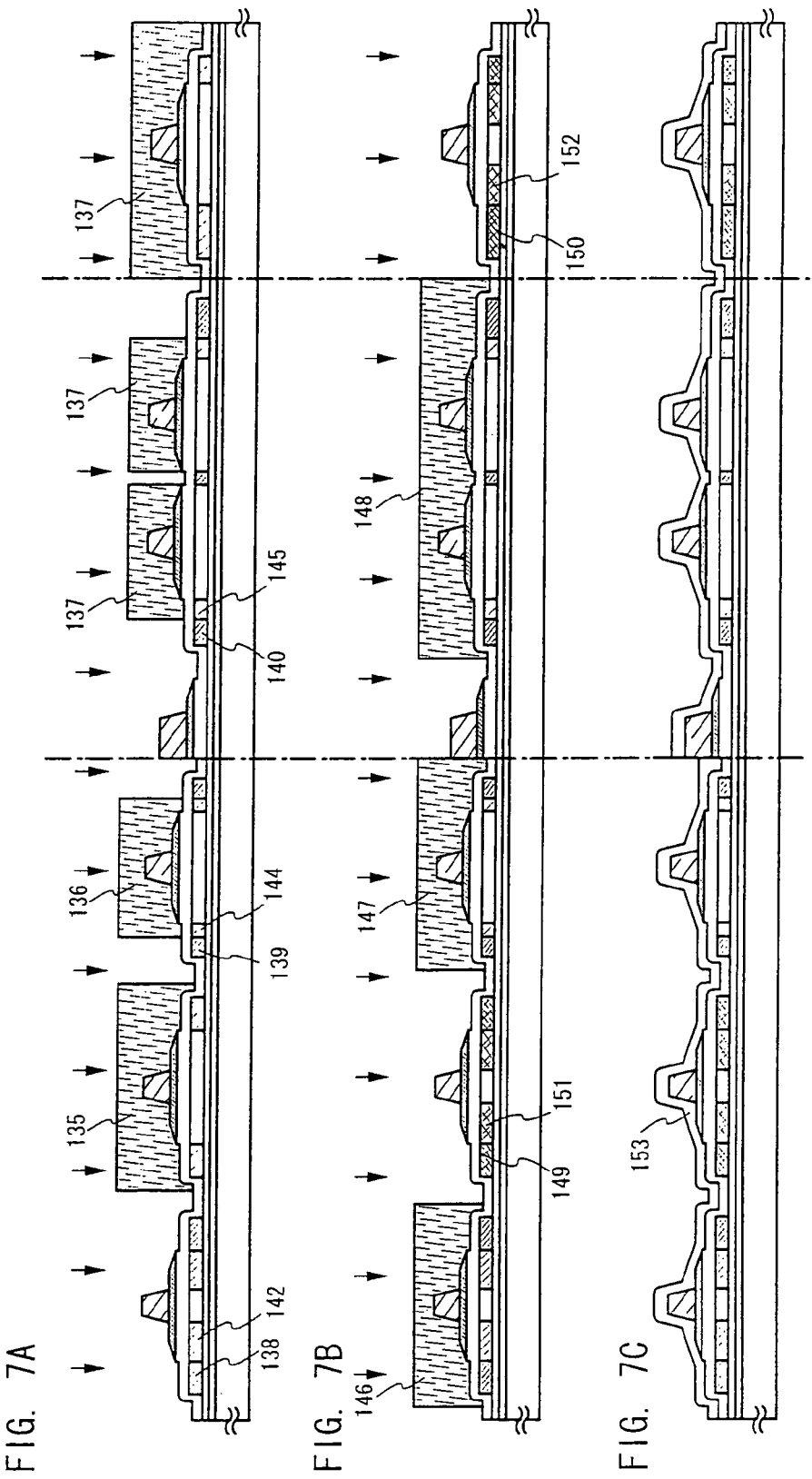

PIXEL PORTION

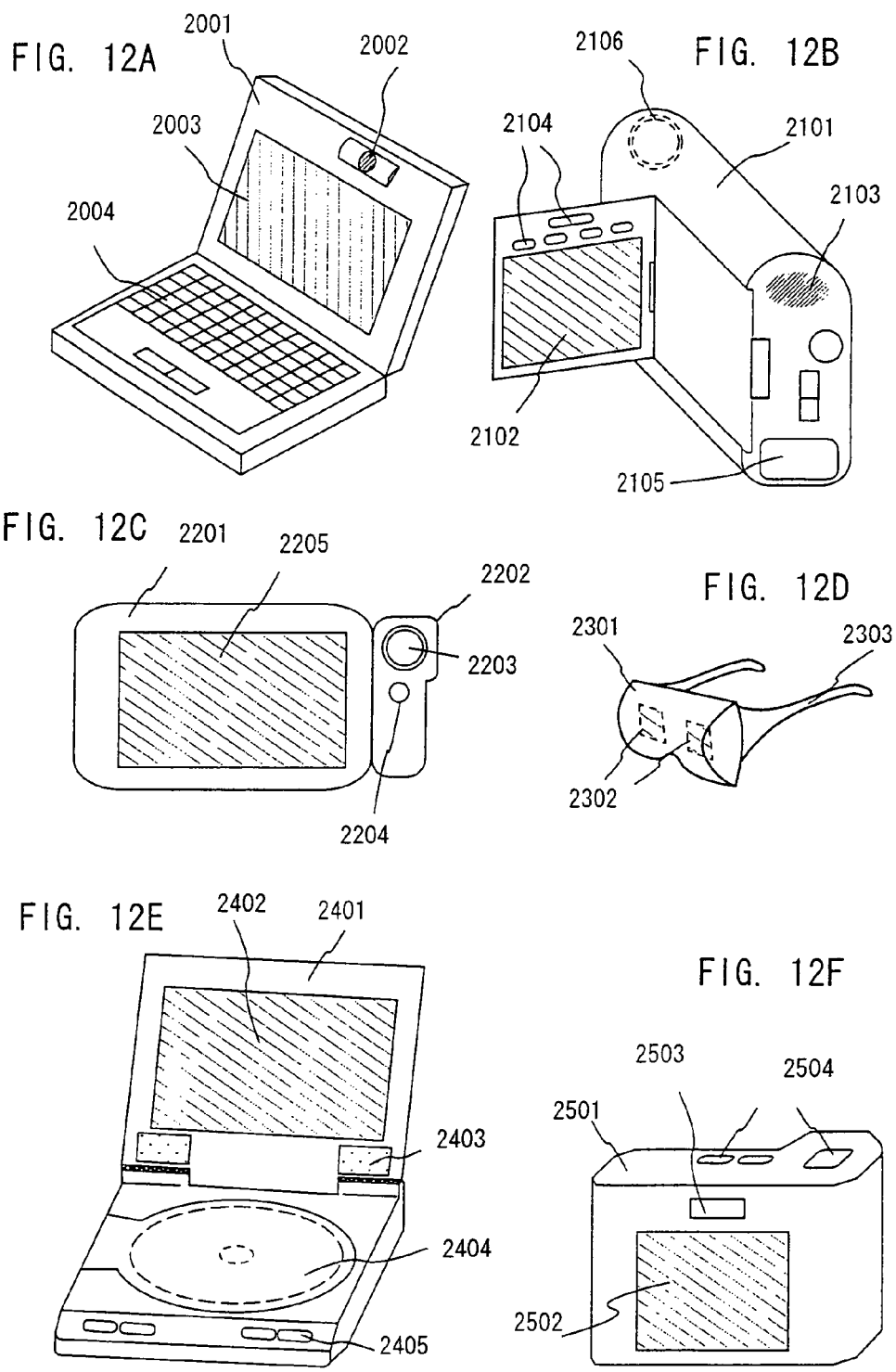

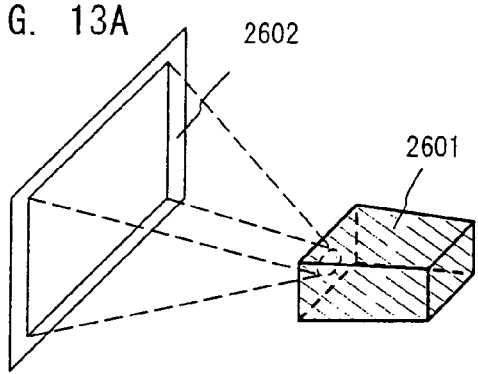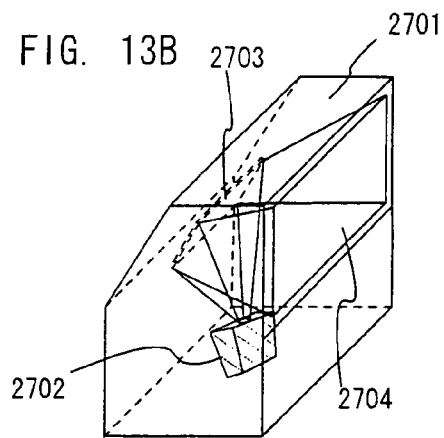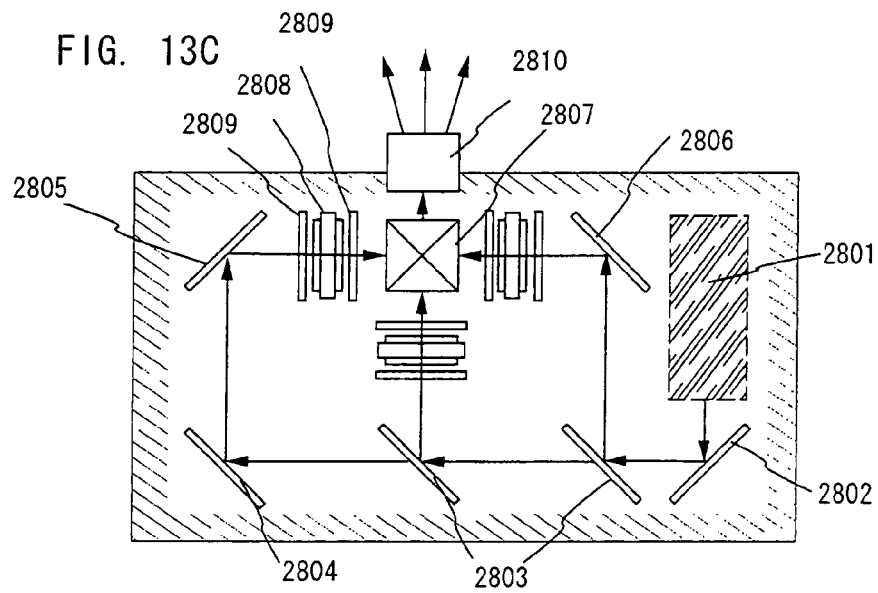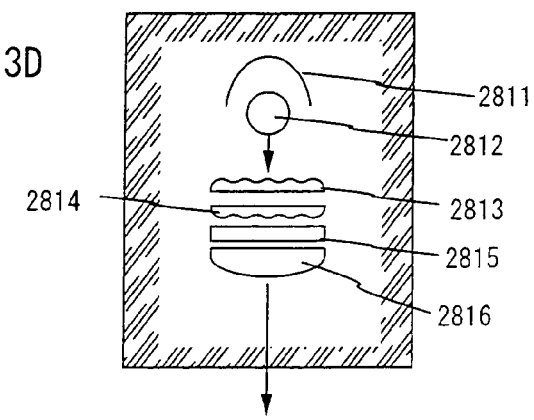

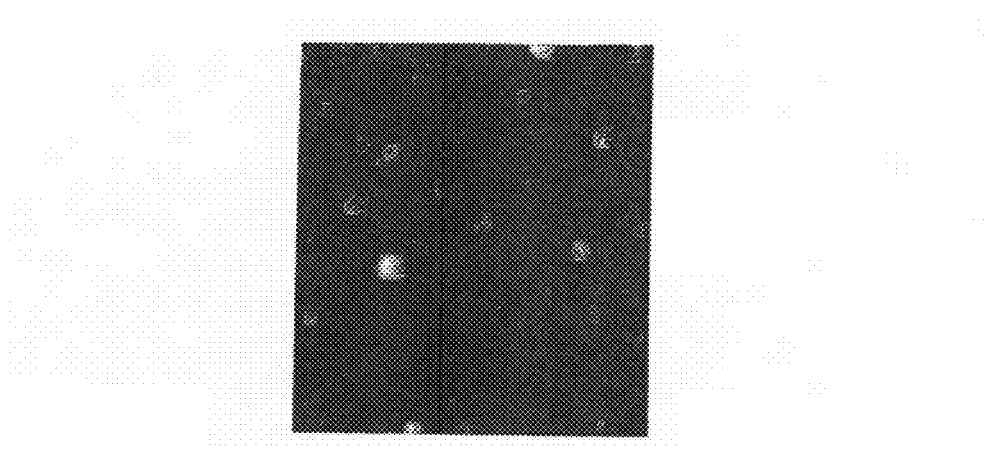
FIG. 15A  Si$_{(1-x)}$Ge$_x$ (x=0.017)
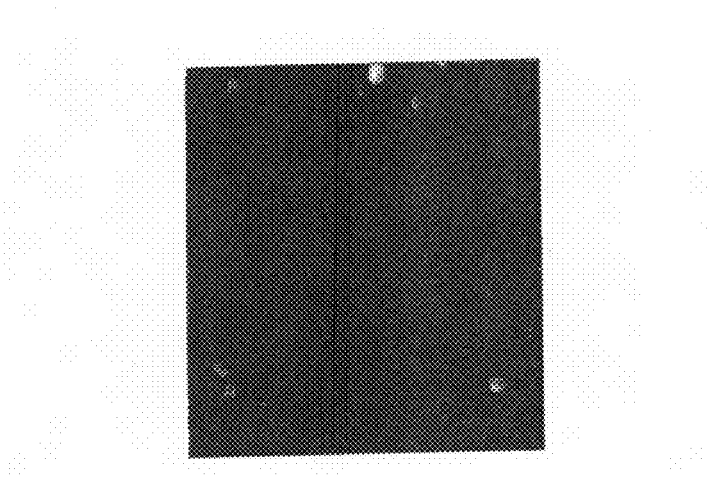
FIG. 15B  Si$_{(1-x)}$Ge$_x$ (x=0.035)
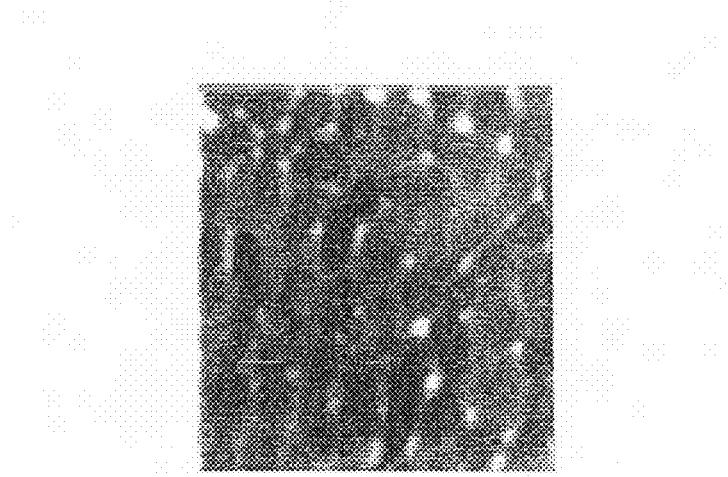
FIG. 15C  Si

SEMICONDUCTOR DEVICE AND METHOD OF MANUFACTURING THE SAME

BACKGROUND OF THE INVENTION

1. Field of the Invention

The present invention relates to a semiconductor device including a circuit composed of a thin film transistor (hereinafter referred to as TFT) and a method of manufacturing the same. For example, the present invention relates to an electro-optical device represented by a liquid crystal display panel and to an electronic equipment incorporating the above-mentioned electro-optical device as a part thereof.

2. Description of the Related Art

Note that, the term semiconductor device defined in this specification refers to all the devices which can operate by utilizing a semiconductor characteristic, and the electro-optical device, a semiconductor circuit and the electronic equipment are all included in a category of the semiconductor device.

In recent years, development of a semiconductor device has been in progress, in which the thin film transistor (TFT) is formed by using a semiconductor thin film (film thickness: approximately several to several hundreds of nm) formed on a substrate having an insulating surface and the TFT is adapted to constitute a large-area integrated circuit.

An active matrix type liquid crystal module, an EL module, and a contact image sensor are known as a typical example thereof. In particular, the TFT using a silicon film having a crystalline structure (typically, a polysilicon film) as an active layer (hereinafter, referred to as polysilicon TFT) is high in a field effect mobility and thus can be used to form a circuit having various functions.

For example, the liquid crystal module mounted onto a liquid crystal display device includes on one substrate a pixel portion and a driver circuit such as a shift register circuit, level shifter circuit, buffer circuit, or sampling circuit which is based on a CMOS circuit. The pixel portion performs an image display for each functional block and the driver circuit controls the pixel portion.

Further, in a pixel portion of the active matrix type liquid crystal module, a TFT (pixel TFT) is arranged in each of several tens to several millions of pixels and each pixel TFT is provided with a pixel electrode. An opposing electrode is provided on an opposite substrate side with a liquid crystal interposed between the two electrodes, to thereby form a kind of capacitor with the liquid crystal used as a dielectric. A voltage applied to each pixel is then controlled by a switching function of the TFT to control the application of charge to the capacitor to drive the liquid crystal, thereby displaying an image through the control of an amount of transmitted light.

The pixel TFT is composed of an n-channel TFT and adapted to drive the liquid crystal by applying a voltage as a switching element. The liquid crystal is driven with an alternating current and a method called a frame inversion driving is employed in many cases. In this method, as a required characteristic of the pixel TFT, it is important to sufficiently lower an OFF current value (a drain current caused to flow at the time of TFT being in OFF state) in order to reduce the power consumption.

Conventionally, when irradiated with a laser light for crystallization or for improvement in crystallinity, the semiconductor film is instantly melted from the surface thereof and then the melted semiconductor film due to heat conduction to the substrate is cooled to solidify from the substrate side. Through the solidifying a process, recrystallization is performed to form a semiconductor film having a crystalline structure with a large grain size. However, the semiconductor film once melted causes a volume expansion to form unevennesses called ridges on the semiconductor surface. In particular, in a case of a top gate type TFT, the surface having the ridge serves as an interface with a gate insulating film so that element characteristics are largely influenced.

In general, an excimer laser or Ar laser is used for laser annealing in many cases. A method of performing the laser annealing described below has been preferably used because it is suited for mass production with high productivity. That is, a pulse oscillation type laser beam having a high output is processed by an optical system so as to be a square spot whose side is of several centimeters or be linear with a length of, for example, 10 cm or more on a surface to be irradiated and the laser beam is scanned on the surface to be irradiated with the irradiation point relatively changed with respect to there. In particular, in a case where a linear laser beam (hereinafter, referred to as linear beam) is used in the surface to be irradiated, unlike in a case of using a spot-shaped laser beam that requires scanning vertically and laterally, it is sufficient to perform the scanning only in a direction perpendicular to a line direction of the linear beam in order to apply the laser beam to the entire surface to be irradiated, thereby achieving a high productivity. The reason the scanning is performed in the direction perpendicular to the line direction is that the direction enables the most efficient scanning. Because of the high productivity, the linear beam obtained by processing laser having a high output by an appropriate optical system has been mainly used for the laser annealing. Also, the linear beam is applied while being overlapped by gradually shifting it in a transverse direction thereof so that an entire surface of an amorphous silicon film is subjected to the laser annealing, thereby making it possible to crystallize or improve the crystallinity.

Thus, the technique of the laser annealing is indispensable in order to form a semiconductor film having higher electric characteristics in a lower cost.

However, there remain problems in the conventional crystallization by the laser light such that energy is not uniformly applied to the entire film and wavelike traces of irradiation with the laser light are remained in addition to the ridge.

Further, if the unevennesses on the film surface formed after the crystallization are leveled by using an etch back method, a CMP method or the like, the number of steps increases and at the same time the semiconductor film becomes thinner, so that it is difficult to level the surface of the semiconductor thin film having a thickness of 100 nm or less with a good controllability.

SUMMARY OF THE INVENTION

The present invention has been made in view of the above-mentioned problems and provides a technique for solving such problems. An object of the present invention is accordingly to provide a semiconductor device such as an electro-optical device represented by an active matrix type liquid crystal display device which is formed by using a TFT and in which an improvement in operational characteristic and a low power consumption are realized.

In particular, an object of the present invention is to obtain a TFT which has a low OFF current value with a reduced variation.

In order to solve the various problems described above, many experiments and studies have been made in various fields so that the inventors of the present invention found that the levelness (a root mean square roughness (rms) and a peak to valley value (P-V value)) is improved in a main surface of the semiconductor film which contains germanium in a concentration of several %, preferably, 0.1 to 10 atoms % and which is subjected to a laser light irradiation as compared with a case of performing the laser light irradiation to the semiconductor film containing no germanium. Thus, the above-mentioned various problems can be solved to thereby accomplish the present invention.

The structure of the present invention is described below.

The invention disclosed in this specification relates to a semiconductor device comprising a thin film transistor having a semiconductor layer formed on an insulating film, characterized in that:

the semiconductor layer formed of a semiconductor film containing silicon as a main component and containing germanium, is used as an active layer; and the active layer has a P-V value of less than 70 nm which indicates a surface roughness of a main surface thereof.

Further, according to another structure of the invention, there is provided a semiconductor device comprising a thin film transistor having a semiconductor layer formed on an insulating film, characterized in that:

the semiconductor layer formed of a semiconductor film containing silicon as a main component and containing germanium, is used as an active layer; and the active layer has an rms of less than 10 nm which indicates a surface roughness of a main surface thereof.

Also, according to still another structure of the invention. there is provided a semiconductor device comprising a thin film transistor having a semiconductor layer formed on an insulating film. characterized in that:

the semiconductor layer formed of a semiconductor film containing silicon as a main component and containing germanium, is used as an active layer; and the active layer has an rms of less than 10 nm and a P-V value of less than 70 nm which each indicate a surface roughness of a main surface thereof.

Also, in the above-mentioned structures, the semiconductor device is characterized in that the semiconductor film contains the germanium in a concentration of 0.1 to 10 atoms % and serves as a silicon film having a crystalline structure.

Also, in the above-mentioned structures, the semiconductor device is characterized in that the semiconductor film contains a metal element in a concentration of $1\times10^{16}/cm^3$ to $5\times10^{18}/cm^3$ and serves as a silicon film having a crystalline structure. Further, the metal element is a metal element for accelerating a crystallization of silicon and is at least one element selected from the group consisting of Fe, Ni, Co, Ru, Rh, Pd, Os, Ir, Pt, Cu and Au.

Also, it is possible to irradiate the semiconductor film containing germanium in a concentration of 0.1 to 10 atoms % with a laser light in an atmosphere or in an oxygen atmosphere to remove an oxide film formed on a surface of the semiconductor film and subsequently to irradiate with the laser light in an inert atmosphere or in a vacuum, thereby forming a semiconductor film having a considerably leveled upper main surface.

Further, the structure in a manufacturing method of the present invention is described below.

The invention relates to a method of manufacturing a semiconductor device. characterized by comprising:

a first step of forming on an insulating surface a semiconductor film that contains germanium in a concentration of 0.1 to 10 atoms % and has an amorphous structure;

a second step of performing heat treatment to the semiconductor film having the amorphous structure and then irradiating it with a laser light for crystallization to form a first semiconductor film having a crystalline structure and an oxide film thereon;

a third step of removing the oxide film; and a fourth step of irradiating a laser light in an inert gas atmosphere or in a vacuum to level a surface of the semiconductor film.

In the above-mentioned structure, the method of manufacturing a semiconductor device is characterized in that an energy density of the laser light in the fourth step is higher than that of the laser light of the second step.

Also, in the above-mentioned structure, a step of adding a metal element for accelerating a crystallization may be provided before the second step.

Further, according to another structure of the invention, there is provided a method of manufacturing a semiconductor device, characterized by comprising:

a first step of forming on an insulating surface a first semiconductor film that contains germanium in a concentration of 0.1 to 10 atoms % and has an amorphous structure;

a second step of adding a metal element for accelerating a crystallization to the first semiconductor film having the amorphous structure;

a third step of performing heat treatment to the first semiconductor film and then irradiating it with a laser light to form a first semiconductor film having a crystalline structure and an oxide film thereon;

a fourth step of removing the oxide film;

a fifth step of irradiating a laser light in an inert gas atmosphere or in a vacuum to level a surface of the first semiconductor film:

a sixth step of oxidizing the surface of the semiconductor film having the crystalline structure with a solution containing ozone;

a seventh step of forming a second semiconductor film including a rare gas element on the oxide film;

an eighth step of allowing the second semiconductor film to getter the metal element to remove or reduce the metal element in the first semiconductor film having the crystalline structure; and a ninth step of removing the second semiconductor film.

Also, in the above-mentioned structure, the method of manufacturing a semiconductor device is characterized in that an energy density of the laser light in the fifth step is higher than that of the laser light in the third step.

BRIEF DESCRIPTION OF THE DRAWINGS

In the accompanying drawings:

FIG. 2 is a graph showing a root mean square roughness (rms) obtained by an AFM;

FIGS. 6A to 6D are views showing manufacturing steps of an active matrix substrate (Embodiment 2);

FIGS. 7A to 7C are views showing manufacturing steps of the active matrix substrate (Embodiment 2);

FIGS. 12A to 12F each show an example of electronic equipment (Embodiment 6);

FIGS. 13A to 13D each show an example of the electronic equipment (Embodiment 6);

FIGS. 15A to 15C are microphotographs showing surfaces of a silicon germanium film and a silicon film.

DESCRIPTION OF THE PREFERRED EMBODIMENTS

Embodiment Mode

Embodiment Mode of the present invention will be described below with reference to FIGS. 1A to 1E.

Figure 1:
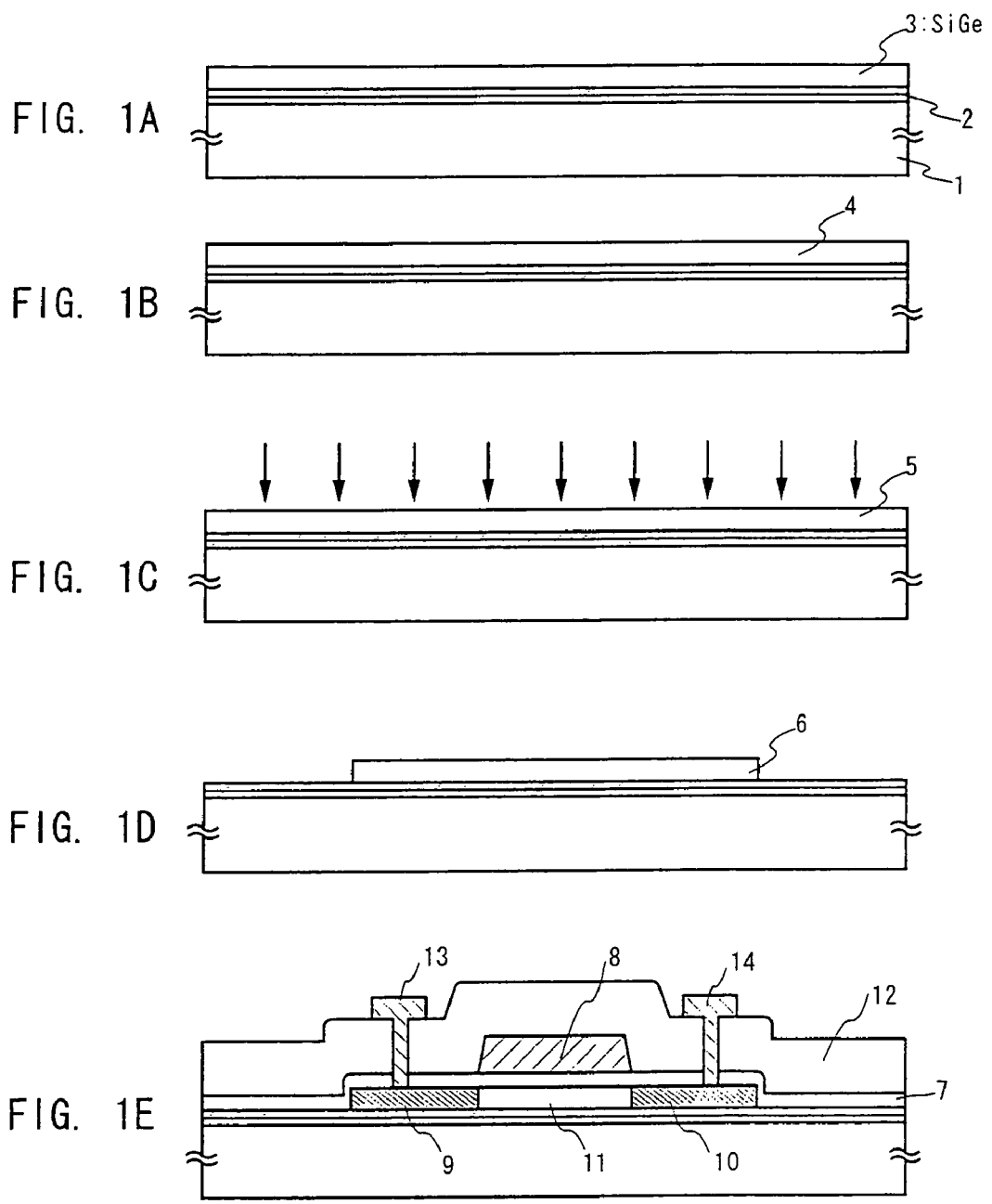
FIGS. 1A to 1E are views showing the present invention.

First, an amorphous semiconductor film 3 containing germanium is formed on an insulating surface. For example, a base insulating film is formed on a quartz substrate or glass substrate. Herein. the insulating film mainly containing silicon. for example, an oxide silicon film, a nitride silicon film or an oxynitride film, or a laminate thereof is formed on a glass substrate 1 as a base insulating film 2 (FIG. 1A). Note that, the base insulating film 2 is provided for the purpose of preventing diffusion of impurities from the substrate and in some cases it is not particularly necessary to provide the film depending on the substrate to be used.

The amorphous semiconductor film 3 containing germanium is formed by a plasma CVD method, a low pressure CVD method, or other methods as appropriate. When using the plasma CVD method, reaction gas made of $SiH_4$ and $GeH_4$, and optionally a reaction gas made of $GeH_4$ that is diluted with $SiH_4$ and $H_2$ are introduced into a reaction chamber to perform a high frequency discharge with a frequency of 1 to 200 MHZ for decomposition, thereby depositing the amorphous semiconductor film on the substrate. As for the reaction gas, $Si_2H_6$ or $SiF_4$, and $GeF_4$ may be used instead of $SiH_4$ and $GeH_4$, respectively. Also, in a case of using the low pressure CVD method, it is possible to employ such reaction gases. Preferably, the reaction gas is diluted with He and the amorphous semiconductor film is deposited on the substrate at a temperature of 400 to 500° C. In any case, the above-mentioned gases used in the present invention are those purified up to a high purity in order to reduce a concentration of an impurity element such as oxygen, nitrogen or carbon which is taken in the deposited amorphous semiconductor film. Note that, the thickness of the deposited amorphous semiconductor film is set to 20 to 100 nm.

Next, the amorphous semiconductor film containing germanium is crystallized by heat treatment (FIG. 1B). In order to crystallize the amorphous semiconductor film containing germanium. it is necessary to perform the heat treatment at 600° C. or more for 10 hours or more.

Irradiation with laser light is then performed to improve a crystallization rate and to repair defects remaining in a crystal grain (FIG. 1C). When applying the laser light to an amorphous semiconductor film containing no germanium, large unevennesses are formed in the surface thereof. On the other hand. when applying the laser light to the amorphous semiconductor film containing germanium. although the unevennesses are similarly formed, it is small enough to maintain the levelness of the surface.

For the irradiation with laser light, excimer laser having a wavelength of 400 nm or less, or a second harmonic (wavelength: 532 nm) to a fourth harmonic (wavelength: 266 nm) of YAG laser or $YVO_4$ laser are used as a light source. The laser light above is condensed into a linear or spot shape by the optical system to be irradiated with its energy density set to 100 to 700 $mJ/cm^2$ and the processing is performed by scanning the laser beam thus condensed over a predetermined region of the substrate.

Note that, a case of using pulse laser is described here by way of example. but continuous oscillation type laser may be also used. It is preferred that in order to obtain the crystal having a large grain size upon the crystallization of the amorphous semiconductor film, solid laser capable of the continuous oscillation is used in combination with the application of a second harmonic to a fourth harmonic of a fundamental wave. Typically, the second harmonic (wavelength: 532 nm) or third harmonic (wavelength: 355 nm) of $Nd:YVO_4$ laser (fundamental wave: 1064 nm) may be applied. When using the continuous oscillation type laser. the laser light emitted from the continuous oscillation type $YVO_4$ laser with an output of 10 W is transformed into a harmonic by a nonlinear optical element. Also, there is a method in which $YVO_4$ crystal and nonlinear optical element are put into a resonator to emit the harmonic. Then. preferably, it is formed into a laser light of a rectangular or elliptic shape on the irradiation surface by the optical system to be applied to a member to be processed. The required energy density at that time is approximately 0.01 to 100 $MW/cm^2$ (preferably, 0.1 to 10 $MW/cm^2$). The irradiation may be performed in such a manner that the semiconductor film is moved relative to the laser light at a speed of approximately 10 to 2,000 cm/s.

In addition, instead of the laser, a halogen lamp, xenon lamp, mercury lamp. metal halide lamp, or the like can be used as the light source.

Considering the productivity of the TFT, the above-mentioned heat treatment is not always suitable, so that the crystallization of the amorphous silicon film may be performed only through the irradiation with the laser light (the pulse oscillation type excimer laser or the continuous oscillation type laser (second harmonic of $YVO_4$ laser)). Also, a technique disclosed in JP 07-130652 A or JP 08-78329 A may be used in which a metal element for accelerating the crystallization of the silicon is introduced and a crystalline silicon film is formed by heat treatment at a temperature lower than that in the conventional case.

In addition, in order to further enhance the levelness. it is also possible that after the above laser irradiation an oxide film (not shown) formed by the laser irradiation is removed by diluted hydrofluoric acid or the like to apply the laser light (with the energy density higher than the previously applied laser light) in an inert atmosphere or in a vacuum again.

Then, the leveled semiconductor film is patterned to form a semiconductor layer 6 having a desired shape by a known patterning method (FIG. 1D). It is desirable that before the formation of a mask made of resist a thin oxide film is formed on the surface thereof with ozone water.

The surface of the semiconductor layer is then washed with an etchant containing hydrofluoric acid to form an insulating film mainly containing silicon and serving as a gate insulating film 7. The surface washing and formation of the gate insulating film are desirably conducted continuously without an exposure to the outside air.

Next, the surface of the gate insulating film 7 is washed and thereafter a gate electrode 8 is formed. An impurity element (such as P or As) imparting an n-type conductivity to the semiconductor (in this case, phosphorous) is then added appropriately to form a source region 9 and a drain region 10. After the addition thereof, the heat treatment, strong light irradiation or laser light irradiation is performed for activating the impurity element. Also, at the same time as the activation, plasma damage applied to the gate insulating film or that applied to an interface between the gate insulating film and the semiconductor layer can be recovered. In particular, it is highly effective that the second harmonic of the YAG laser is applied from the front or rear side in an atmosphere of a room temperature to 300° C. to activate the impurity element. YAG laser is preferable as the activation means in terms of less maintenance.

Subsequent steps are as follows: forming an interlayer insulating film 12. performing a hydrogenation, forming contact holes reaching the source region and the drain region, and forming a source electrode 13 and a drain electrode 14 to complete TFT (n-channel TFT) (FIG. 1E).

The surface of a channel forming region 11 of the TFT thus obtained may have a root mean square roughness (rms) of less than 10 nm and a P-V value of less than 70 nm.

The present invention is not limited to the TFT structure shown in FIG. 1E but may employ an LDD structure (a lightly doped drain structure) in which an LDD region is interposed between the channel forming region and the drain region (or the source region) as necessary. This structure is a structure in which a region added with an impurity element in a low concentration is provided between the channel forming region and the source or drain region formed by adding the impurity element in a high concentration. The region is called the LDD region. Further, it is also possible to employ a so-called GOLD (gate-drain overlapped LDD) structure in which the LDD region is arranged so as to overlap the gate electrode through the gate insulating film.

The n-channel TFT is employed here for the description. but it goes without saying that a p-channel TFT can be formed by using a p-type impurity element instead of the n-type impurity element.

Also, the top gate type TFT is described herein as an example, but the present invention can be applied irrespective of the TFT structure and the present invention can be applied, for example, to a bottom gate type (reverse stagger type) TFT or a forward stagger type TFT.

Experiment

Experiments are performed as follows.

A base film is formed on a glass substrate. The base insulating film is composed of a two-layer structure including a first oxynitride silicon film with a thickness of 50 to 100 nm which is formed by using $SiH_4$, $NH_3$, and $N_2O$ as reaction gases and a second oxynitride silicon film with a thickness of 100 to 150 nm which is formed by using $SiH_4$ and $N_2O$ as the reaction gases, the two films being laminated.

Next, after the formation of the base insulating film an amorphous semiconductor film is formed. As the amorphous semiconductor film, an amorphous silicon film, an amorphous silicon film containing, 1.7% germanium to silicon, and an amorphous silicon film containing 3.5% germanium to silicon are formed by a plasma CVD method, respectively.

Subsequently, a nickel containing layer is formed by applying a nickel acetate solution containing nickel in a concentration of 10 ppm in terms of weight by a spinner. A dehydrogenation process is then performed at 500° C. for 1 hour to reduce a hydrogen concentration in the film, followed by heat treatment at 550° C. for 4 hours to form the semiconductor films each having a crystalline structure.

Figure 3:
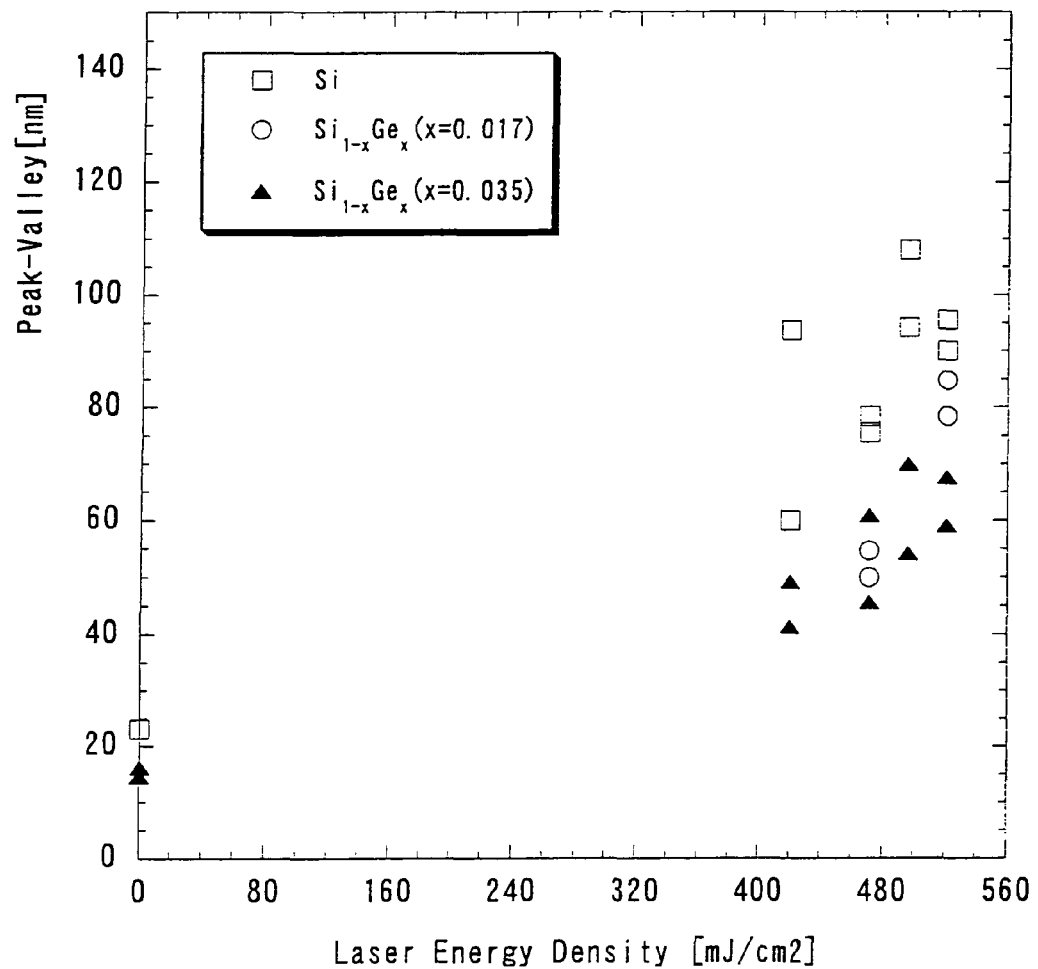
FIG. 3 is a graph showing a P-V value obtained by the AFM.

At this point, as a comparative example, a surface condition of each semiconductor film is measured by an atomic force microscopy (AFM). The measurement results are shown in FIGS. 2 and 3. FIG. 2 shows the root mean square (rms) of the unevenness on the surface, and FIG. 3 shows a peak to valley (P-V) value of the unevenness (a difference in height between the maximum value and the minimum value). Here, the values of FIGS. 2 and 3 both are measured in a region of 3 μm×3 μm.

In order to improve the crystallization rate and repair the defects remaining in the crystal grains, a laser light (XeCl: wavelength of 308 nm) is then irradiated in an atmosphere or in an oxygen atmosphere. As the laser light. an excimer laser light (wavelength: 400 nm or less) and a second harmonic or a third harmonic of YAG laser are used. In any case, a pulse laser light with a repetition frequency of approximately 10 to 1,000 Hz is used and the laser light is condensed into 100 to 500 $mJ/cm^2$ by an optical system to be applied with an overlap ratio of 90 to 95% for scanning of the silicon film surface.

While changing the energy density condition. the laser light is irradiated and the measurement is performed by using the AFM for each condition. The measurement results are shown in FIGS. 2 and 3.

As will be apparent from FIGS. 2 and 3, as the amount of contained germanium increases, the unevenness of the surface becomes smaller. Specifically. the root mean square roughness (rms) and P-V value of the surface are lowered to increase the levelness of the surface.

As for the root mean square roughness (rms), after the irradiation with the laser light the silicon film containing no germanium has approximately 10 to 30 nm, whereas in the film allowed to contain the germanium the root mean square (rms) of the unevenness on the surface is suppressed to less than 10 nm.

As for the P-V value, after the irradiation with the laser light the silicon film containing no germanium has approximately 70 to 100 nm. whereas in the film allowed to contain the germanium the P-V value of the unevenness of the surface is suppressed to less than 70 nm.

Here, FIGS. 15A to 15C are microphotographs in cases of irradiating films with a laser light in an atmosphere with the number of shots set to 13, the repetition frequency set to 30 Hz, and the energy density set to 521 $mJ/cm^2$. FIG. 15A shows a case of a silicon germanium ($Si_{1-X}Ge_X$ (X=0.017)) film, FIG. 15B shows a case of a silicon germanium ($Si_{1-X}Ge_X$ (X=0.035)) film, and FIG. 15C shows a case of a silicon film. As can be also seen from the microphotographs, the semiconductor films containing the germanium (FIGS. 15A and 15B) are high in levelness with less unevenness in comparison with the semiconductor film containing no germanium (FIG. 15C).

Further, the semiconductor film obtained according. to the above-mentioned method has a high orientation ratio with respect to {101} lattice plane. As to the orientation ratio of the crystal, the crystal grains are oriented largely to {101} lattice plane and it can be also observed that the crystal grains tend to orient toward {311} plane that is placed in an intermediate position between {001} plane and {111} plane. Specifically, the ratios of the crystal grains whose angles to the surface of the semiconductor layer are 10° or less are 20% or more in {101} lattice plane, 3% or less in {001} plane, and 5% or less in {111} plane, respectively. The detection is performed by using an electron backscatter diffraction pattern method.

The distribution of crystal orientation is obtained by the electron backscatter diffraction pattern (EBSP), which is a method of performing an analysis of the crystal orientation from the backscatter of primary electrons with a dedicated detector provided in the scanning electron microscopy (SEM). By repeating the orientation analysis while shifting a position of a sample to which an electron beam is applied (mapping), the information on the crystal orientation or orientation in the plane-shaped sample can be obtained. The width of an incident electron beam varies depending on the type of electron gun of the scanning electron microscopy, but in a case of a Schottky field emission type, a considerably thin electron beam of 10 to 20 nm is applied. In the mapping, with an increase in the number of measurement points or in an area of measurement region, the further averaged information on the crystal orientation can be obtained. Actually, the measurement is performed in a region of 100 µm×100 µm at approximately 10,000 points (interval: 1 µm) to 40,000 points (interval: 0.5 µm). After the crystal orientation of each crystal grain is completely determined by the mapping, it is possible to statistically display the condition of the orientation of the crystal grains to a film. If the distribution is concentrated around {101} lattice plane, in the actual film <101> orientation of each crystal grain is in a direction substantially perpendicular to the substrate. At this time. it can be supposed that the grains are arranged around there with some fluctuation. There is provided an acceptable value to the fluctuation angle, for example, by 5 degrees or 10 degrees and the ratio of the crystal grains with the angle less than the above value is indicated by numeric values. Herein, the acceptable deviation angle is set to 5 or 10 degrees as described above and the ratio of the crystal grains whose angles fall within the range is called the orientation rate of crystal.

The crystalline silicon film formed by the conventional method is influenced by the substrate or the base insulating film at the time of crystallization and thus a plurality of crystal grains are deposited. Therefore, although there is the tendency of orientating to {111} plane, the ratio of crystal grains oriented toward the plane direction is low.

By using as an active layer of the TFT the thus obtained semiconductor film that is high in levelness and in orientation rate of crystal in the semiconductor film. the semiconductor device which has a low OFF current value with a reduced variation can be obtained.

The present invention structured as described above will be further described in detail by use of embodiments below.

Embodiment 1

An example of manufacturing TFTs conducted laser irradiation of two times is shown in FIGS. 4 and 5.

Figure 4A:
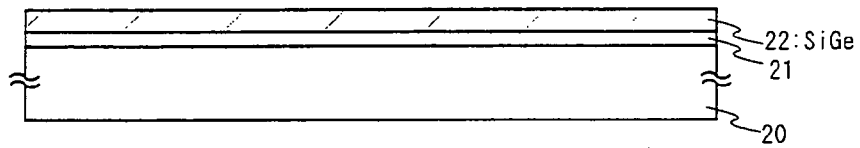
FIGS. 4A to 4F are views showing manufacturing steps of the present invention (Embodiment 1)
Figure 4B:
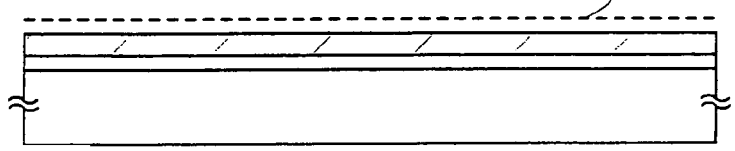

Reference numeral 20 in FIG. 4A denotes a substrate having an insulating surface, reference numeral 21 denotes an insulating film that becomes a blocking layer, and reference numeral 22 denotes a semiconductor film having an amorphous structure.

First, the base insulating film 21 is formed on the substrate 20 from an insulating film such as a silicon oxide film, a silicon nitride film. or a silicon oxynitride film ($SiO_xN_y$), as shown in FIG. 4A. A typical example is a two layer structure as the base insulating film 21. The structure is employed. in which a first silicon oxynitride film formed to have a thickness of 50 to 100 nm using $SiH_4$, $NH_3$, and $N_2O$ as reaction gas, and a second silicon oxynitride film formed to have a thickness of 100 to 150 nm using $SiH_4$ and $N_2O$ as reaction gas are laminated. Further, it is preferable to use a silicon nitride film (SiN film) with a film thickness of 10 nm or less or a second silicon oxynitride film ($SiN_xO_y$ film. where x>>y) as one layer of the base insulating film 21. Nickel has a tendency to easily move to regions including oxygen with a high concentration, and therefore it is extremely effective to use a silicon nitride film as the base insulating film that contacts the semiconductor film. Further, a three layer structure in which a first silicon oxynitride film, a second silicon oxynitride film, and a silicon nitride film are laminated in order may also be used.

The first semiconductor film 22 containing germanium with an amorphous structure is then formed on the base insulating film. A film such as an amorphous silicon germanium film is typically applied, and is formed to have a thickness of 10 to 100 nm by plasma CVD, reduced pressure CVD, or sputtering. It is preferable to reduce the concentration of impurities such as oxygen and nitrogen contained in the first semiconductor film 22 to a concentration of $5\times10^{18}$/cm$^3$ or less (atomic concentration measured using secondary ion mass spectrometry. (SIMS)) in order to obtain a semiconductor film with a satisfactory crystalline structure by later crystallizing. These impurity elements cause interference in the later crystallization. and also cause the concentration of capture centers and recombination centers to increase after crystallization. It is therefore desirable to use material gas with high purity and to employ an ultra-high vacuum CVD apparatus in which the inside of its reaction chamber has undergone mirrored surface processing (electrolytic polishing), and which is provided with an oil free vacuum evacuation system.

Crystallization is performed next using the technique disclosed in Japanese Patent Application Laid-open No. Hei 8-78329 as a technique for crystallizing the first semiconductor film 22. The technique in Japanese Patent Application Laid-open No. Hei 8-78329 is that a metallic element for promoting crystallization is selectively added to the amorphous silicon film, and heat treatment is performed. A semiconductor film is thus formed which has a crystalline structure spreading out from the region to which the metallic element is added. First, a nickel acetate solution containing 1 to 100 ppm by weight of a metallic element (nickel is used here) which has a catalytic action for promoting crystallization is applied to the surface of the first semiconductor film 22 by a spinner to form a nickel containing layer 23. (See FIG. 4B.) A means for forming an extremely thin film by sputtering, evaporation, or plasma processing may also be employed as an other means for forming the nickel containing layer 23. Furthermore, although an example in which application is performed over the entire surface is shown here, the nickel containing layer may be formed selectively by forming a mask.

Figure 4C:
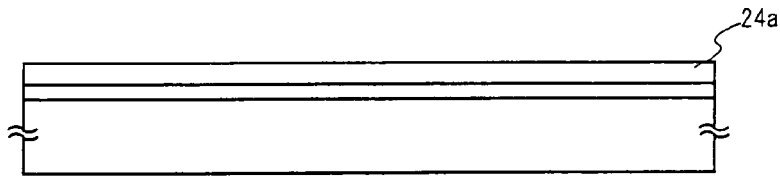
Figure 4D:
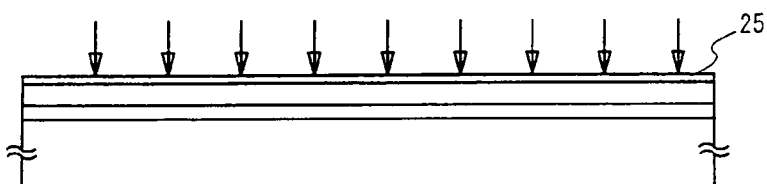
Figure 4E:
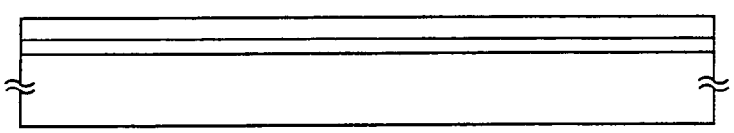
Figure 4F:
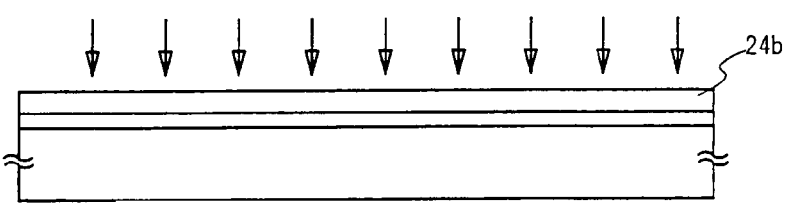

Heat treatment is performed next to perform crystallization. In this case. silicides are formed at portions of the semiconductor film which are in contact with the metallic element that promotes crystallization of semiconductor. and then crystallization proceeds with the silicides acting as nuclei. A first semiconductor film 24a with a crystalline structure is thus formed as shown in FIG. 4C. Note that it is desirable that the concentration of oxygen contained in the first semiconductor film 24a after crystallization be is $5\times10^{18}$/cm$^3$ or less. Heat treatment for dehydrogenation is here performed at 450° C. for one hour, and then heat treatment for crystallization is performed for 4 to 24 hours at 550 to 650° C. Further, it is possible to use one kind or a plurality of kinds, selected from the group consisting of infrared light, visible light, and ultraviolet light in the case of performing crystallization by irradiating strong light. Light emitted from a halogen lamp, a metal halide lamp. a xenon arc lamp, a carbon arc lamp, a high pressure sodium lamp, or a high pressure mercury lamp is typically used. A light source of a lump may be turned on for 1 to 60 seconds, preferably 30 and 60 seconds, and this operation may be repeated one to 10 times to heat the semiconductor film instantaneously to a temperature on the order of 600 to 1000° C. Note that, if necessary, heat treatment for emitting hydrogen contained in the first semiconductor film 24a may also be performed before irradiating strong light. Furthermore, crystallization may also be performed by using heat treatment and irradiation of strong light at the same time. Considering productivity, it is preferable that crystallization be performed by strong light irradiation.

The metallic element (nickel here) remains in the first semiconductor film 24a thus obtained. Although the metallic element is not distributed uniformly through the film, a concentration exceeding $1 \times 10^{19}/cm^3$ remains on average. It is of course possible to form various types of semiconductor elements such as TFTs even in this state, but the metallic element is removed by a gettering method described later.

Laser light (first laser light) is next irradiated to first semiconductor film 24a with the crystalline in an atmosphere or in an oxygen atmosphere, in order to increase crystallinity (proportion of crystalline components to the total volume of the film) and in order to repair defects remaining in crystal grains. Unevenness is formed in the surface and a thin oxide film 25 is formed if laser light (a first laser light) is irradiated (See FIG. 4D). The laser light (a first laser light) used is excimer laser light with a wavelength of 400 nm or less, or second harmonic or third harmonic of YAG laser. In addition, light emitted from an ultraviolet light lamp may also be used as a substitute for the excimer laser light. In any case, pulse laser light with a repetition frequency of approximately 10 to 1000 Hz is used, the pulse laser light is condensed to 100 to 500 $mJ/cm^2$ by an optical system, and irradiation is performed with an overlap ratio of 90 to 95%, whereby the silicon film surface may be scanned.

Next, the oxide film 25 is removed (See FIG. 1E). Laser light (second laser light) is then irradiated to the first semiconductor film with the crystalline structure in a nitrogen atmosphere or in a vacuum. The P-V value (Peak to Valley value: difference between the maximum value and the minimum value of height) of the unevenness formed by irradiating the first laser light and rms is reduced when the second laser light is irradiated. Namely, leveled semiconductor film 24b is performed (See FIG. 1F). The laser light (the second laser light) used is excimer laser light with a wavelength of 400 nm or less, or second harmonic and third harmonic of YAG laser. In addition, light emitted from an ultraviolet light lamp may also be used as a substitute for the excimer laser light. Note that the energy density of the second laser light is made larger than the energy density of the first laser light. preferably from 30 to 60 $mJ/cm^2$ larger.

Figure 5A:
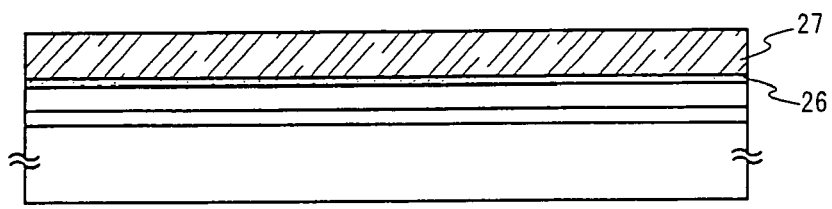
FIGS. 5A to 5D are views showing manufacturing steps of the present invention (Embodiment 1)

In addition, an oxide film (referred to as a chemical oxide film) is formed by using an ozone containing aqueous solution (typically ozone water) to form a barrier layer 26 of an oxide film with a total thickness of 1 to 10 nm. Then. a second semiconductor film 27 containing an inert gas element is formed on the barrier layer 26 (FIG. 5A). The barrier layer 26 functions as an etching stopper in selectively removing the second semiconductor film 106 alone later. Further. the chemical oxide can also be formed similarly by processing with an aqueous solution in which an acid such as sulfuric acid, hydrochloric acid, or nitric acid is mixed with aqueous hydrogen peroxide as a substrate for the ozone containing aqueous solution. It may also be used as another method of forming the barrier layer 26 that ozone is generated by irradiating ultraviolet light in an oxygen atmosphere and the surface of the semiconductor film with the crystalline structure is oxidized. In addition, an oxide film with a thickness on the order of 1 to 10 nm may also be deposited as a barrier layer with a method such as plasma CVD, sputtering, or evaporation as an another method for forming the barrier layer 26. Further, a thin oxide film may also be formed by heating with a clean oven at a temperature on the order of 200 to 350° C., as an another method of forming the barrier layer 26. Note that there are no particular limitations on a method of forming the barrier layer 26, provided that it is formed by one of, or a combination of, the above stated methods. However, the barrier layer 26 needs to have a film quality or a film thickness in order that nickel within the first semiconductor film is capable of moving to the second semiconductor film by later gettering.

The second semiconductor film 27 containing the inert gas element is formed by sputtering here to form gettering sites. Note that it is preferable that the conditions in sputtering are suitably regulated in order that the inert gas element is not added to the first semiconductor film. One element, or a plurality of elements, selected from the group consisting of helium (He), neon (Ne), argon (Ar). krypton (Kr), and xenon (Xe) are used as the inert gas element. Among these elements, it is preferable to use argon (Ar) which is low cost gas. A target of silicon is used in an atmosphere containing the inert gas element here to form the second semiconductor film. There are two meanings associated with including ions of rare gas element that is inert gas within the film; one is that dangling bonds are formed to impart distortions to the semiconductor film, and the other is that distortions are formed within lattices of the semiconductor film. The distortions within the lattices of the semiconductor film can be obtained remarkably if an element with a greater atomic radius, such as argon (Ar). krypton (Kr), or xenon (Xe) than that of silicon is used. Not only are lattice distortions formed by including the rare gas element within the film, unpaired bonds are also formed to contribute to gettering action.

Furthermore, gettering can be performed utilizing the Coulomb force of phosphorous in addition to gettering with rare gas element, in the case of forming the second semiconductor film by using a target containing phosphorous which is an impurity element with a single conductivity type.

Figure 5B:
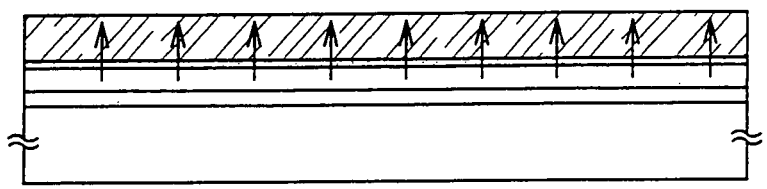

A heat treatment is performed next to perform gettering, for reducing the concentration of the metallic element (nickel) in, or removing the metallic element from, the first semiconductor film (FIG. 5B). A treatment of irradiating strong light or thermal treatment may be performed as the heat treatment. The metallic element moves in the direction of the arrow in FIG. 5B (that is, in the direction from the substrate side toward the surface of the second semiconductor film), to perform removing the metallic element or lowering the concentration of the metallic element. contained in the first semiconductor film 24b covered by the barrier layer 26. The distance where the metallic element move during gettering may be a distance at least on the order of the thickness of the first semiconductor film, and gettering can be accomplished in a relatively short amount of time. Sufficient gettering is performed in order that all of the nickel is made to move to the second semiconductor film 27 without segregating in the first semiconductor film 24b and that nickel contained in the first semiconductor film 24b hardly exists. That is, gettering is performed so that the concentration of the nickel within the first semiconductor film becomes equal to or less than $1 \times 10^{18}/cm^3$, preferably equal to or less than $1 \times 10^{17}/cm^3$.

In this specification. the term gettering indicates emission of a metallic element from a region to be gettered (the first semiconductor film here) by thermal energy, and movement of the metallic element to gettering sites by diffusion. Accordingly, gettering is dependent upon the processing temperature, and proceeds in a shorter amount of time with higher temperature.

Further, a light source of a lump for heating is turned on for 1 to 60 seconds. preferably for 30 to 60 seconds, and this operation is repeated for 1 to 10 times. preferably between 2 and 6 times, in the case of using a process of irradiating strong light as the heat treatment for gettering. Although the light emission strength of the light source may be set arbitrarily, the semiconductor film made to be instantaneously heated to a temperature of 600 to 1000° C., preferably 700 and 750° C.

In the case of performing thermal treatment, heating may be conducted in a nitrogen atmosphere at a temperature of 450 to 800° C. for 1 to 24 hours. for example, at 550° C. for 14 hours. Strong light may also be irradiated in addition to the thermal treatment.

Next, the second semiconductor film only is selectively removed with using the barrier layer 26 as an etching stopper, and the barrier layer formed of the oxide film 26 is also removed. Dry etching which does not utilize a $ClF_3$ plasma, or wet etching by using an alkaline solution such as hydrazine or an aqueous solution containing tetraethyl-ammonium-hydroxide (chemical formula $(CH_3)_4NOH$)) can be performed as the method of selectively etching only the second semiconductor film. Further, it is preferable to remove the barrier layer after removing the second semiconductor film since nickel is detected at high concentration on the surface of the barrier layer by measuring the nickel concentration with TXRF. The barrier layer may be removed by an etchant containing hydrofluoric acid.

Figure 5C:
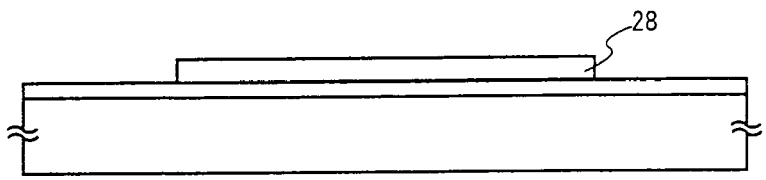

The leveled semiconductor film 24b is next formed into a semiconductor layer 28 with a desired shape by using a known patterning technique (FIG. 5C). It is preferable to form a thin oxide film on the surface by using ozone water before forming a resist mask.

An insulating film including silicon as its main constituent. which becomes a gate insulating film 29, is then formed next after cleaning the surface of the semiconductor film using an etchant containing hydrofluoric acid. It is preferable to clean the surface and form the gate insulating film in succession. without exposing to the atmosphere.

Figure 5D:
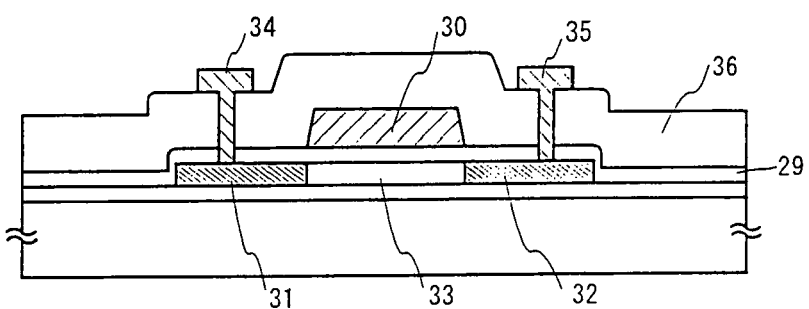

Subsequent processes to completing TFT are performed in the same processes of the Embodiment Modes of the invention (FIG. 5D). Note that the reference numerals 29 to 36 denote a gate insulating film, a gate electrode. a source region, a drain region, a channel forming region, a source electrode. a drain electrode, and an interlayer insulating film respectively.

Furthermore, this embodiment can be freely combined with the Embodiment Modes of the invention. In addition, preset embodiment may also be combined with other known gettering method.

Furthermore, there may be a case in which a semiconductor layer is formed into a predetermined shape by gettering, and then it is performed to irradiating second laser light in an inert gas atmosphere or in a vacuum to perform leveling after removing an oxide film. without irradiating the second laser light before gettering.

Embodiment 2

An embodiment of the present invention is described with reference to FIGS. 6 to 8. Here, a method of simultaneously manufacturing a pixel portion and TFTs (n-channel TFTs and a p-channel TFT) of a driver circuit provided in the periphery of the pixel portion on the same substrate is described in detail.

First, a base insulating film 101 is formed on a substrate 100, and a first semiconductor film having a crystalline structure is obtained. Then. the semiconductor film is etched to have a desired shape to form semiconductor layers 102 to 106 separated from one another in an island shape.

A glass substrate (#1737) is used as the substrate 100. For the base insulating film 101, a silicon oxynitride film 101a formed from $SiH_4$, $NH_3$, and $N_2O$ as material gases (composition ratio: Si=32%, 0=27%, N=24%, H=17%) is formed with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, a silicon hydride oxynitride film 101b formed from $SiH_4$ and $N_2O$ as material gases (composition ratio: Si=32%, 0=59%. N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with $SiH_4$ as a film deposition gas and at a film deposition temperature of 300° C. by using plasma CVD. Also, $Si_2H_6$ or $SiF_4$ instead of $SiH_4$ and $GeF_4$ instead of $GeH_4$ may be used.

In this embodiment, the base film 101 is shown in a form of a two-layer structure, but a single layer of the insulating film or a structure in which two or more layers thereof are laminated may be adopted. Further, there is no limitation on the material of the semiconductor film. However, the semiconductor film may be preferably formed of silicon or silicon germanium ($Si_XGe_{1-X}$ (X=0.0001 to 0.02)) alloy by using a known means (sputtering, LPCVD, plasma CVD. or the like). Further, a plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity element (boron or phosphorous) is performed. Here, an ion doping method is used in which diborane ($B_2H_6$) is plasma-excited without mass-separation, and boron is added to the amorphous silicon film under the doping conditions: an acceleration voltage of 15 kV; a gas flow rate of diborane diluted to 1% with hydrogen of 30 sccm: and a dosage of $2 \times 10^{12}/cm^2$.

Then, a nickel acetate salt solution containing nickel of 10 ppm in weight is applied using a spinner. Instead of the application, a method of spraying nickel elements to the entire surface by sputtering may also be used.

Then, heat treatment is conducted to perform crystallization. thereby forming a semiconductor film having a crystalline structure. A heating process using an electric furnace or irradiation of strong light may be conducted for this heat treatment. In case of the heating process using an electric furnace, it may be conducted at 500 to 650° C. for 4 to 24 hours. Here. after the heating process (500° C. for 1 hour) for dehydrogenation is conducted, the heating process (550° C. for 4 hours) for crystallization is conducted. thereby obtaining a silicon film having a crystalline structure. Note that, although crystallization is performed by using the heating process using a furnace, crystallization may be performed by means of a lamp annealing apparatus. Also note that, although a crystallization technique using nickel as a metal element that promotes crystallization of silicon is used here. other known crystallization techniques, for example, a solid-phase growth method and a laser crystallization method, may be used.

Next, after the oxide film on the surface of the silicon film having a crystalline structure is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 mJ/cm$^2$ by an optical system, and irradiation is performed with an overlap ratio of 90 to 95%. whereby the silicon film surface may be scanned. Note that an oxide film is formed on the surface by the first laser light irradiation since the irradiation is conducted in an atmosphere or in an oxygen atmosphere.

Next, after the oxide film formed by the first light irradiation is removed by dilute hydrofluoric acid, second laser light irradiation is performed in a nitrogen atmosphere or in a vacuum, thereby leveling the semiconductor film surface. Excimer laser light with a wavelength of 400 nm or less, or second harmonic wave or third harmonic wave of a YAG laser is used as the laser light (second laser light). The energy density of the second laser light is made larger than that of the first laser light. preferably made larger by 30 to 60 mJ/cm$^2$.

Next, the surface is processed with ozone water for 120 seconds, thereby forming a barrier layer comprised of an oxide film with a thickness of 1 to 5 nm in total.

Then, an amorphous silicon film containing an argon element. which becomes a gettering site, is formed on the barrier layer to have a thickness of 150 nm by sputtering. The film deposition conditions with sputtering in this embodiment are: a film deposition pressure of 0.3 Pa; a gas (Ar) flow rate of 50 sccm: a film deposition power of 3 kW; and a substrate temperature of 150° C. Note that under the above conditions, the atomic concentration of the argon element contained in the amorphous silicon film is $3\times10^{20}$/cm$^3$ to $6\times10^{20}$/cm$^3$, and the atomic concentration of oxygen is $1\times10^{19}$/cm$^3$ to $3\times10^{19}$/cm$^3$. Thereafter, heat treatment at 650° C. for 3 minutes is conducted using the lamp annealing apparatus to perform gettering.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 102 to 106 separated from one another. After the formation of the semiconductor layers. the mask made of resist is removed.

Then, the oxide film is removed with the etchant containing hydrofluoric acid, and at the same time, the surface of the silicon film is cleaned. Thereafter. an insulating film containing silicon as its main constituent, which becomes a gate insulating film 107, is formed. In this embodiment. a silicon oxynitride film (composition ratio: Si=32%, O=59%, N=7%, H=2%) is formed with a thickness of 115 nm by plasma CVD.

Next, as shown in FIG. 6A, on the gate insulating film 107, a first conductive film 108a with a thickness of 20 to 100 nm and a second conductive film 108b with a thickness of 100 to 400 nm are formed in lamination. In this embodiment, a 50 nm thick tantalum nitride film and a 370 nm thick tungsten film are sequentially laminated on the gate insulating film 107.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous. or an AgPdCu alloy may be used as the first conductive film and the second conductive film. Further, the present invention is not limited to a two-layer structure. For example, a three-layer structure may be adopted in which a 50 nm thick tungsten film. an alloy film of aluminum and silicon (Al—Si) with a thickness of 500 nm. and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film. and a titanium film may be used in place of the titanium nitride film of the third conductive film. In addition. a single layer structure may also be adopted.

Next, as shown in FIG. 6B, masks 110 to 115 are formed by an exposure step. and a first etching process for forming gate electrodes and wirings is performed. The first etching process is performed with first and second etching conditions. An ICP (inductively coupled plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. Note that chlorine-based gases typified by $Cl_2$, $BCl_3$, $SiCl_4$, and $CCl_4$, fluorine-based gases typified by $CF_4$, $SF_6$, and $NF_3$, and $O_2$ can be appropriately used as etching gases.

In this embodiment, RF (13.56 MHZ) power of 150 W is applied also to the substrate (sample stage) to apply a substantially negative self-bias voltage. With the first etching conditions, a W film is etched to form an end portion of the first conductive layer into a tapered shape. Under the first etching conditions. an etching rate to W is 200.39 nm/min, an etching rate to TaN is 80.32 nm/min. and a selection ratio of W to TaN is about 2.5. Further, with the first etching conditions. a taper angle of W is approximately 26°. Thereafter, the first etching conditions are changed to the second etching conditions without removing the masks 110 to 115 made of resist. $CF_4$ and $Cl_2$ are used as etching gases, the flow rate of the gases is set to 30/30 sccm, and RF (13.56 MHZ) power of 500 W is applied to a coil-shape electrode with a pressure of 1 Pa to generate plasma. thereby performing etching for about 30 seconds. RF (13.56 MHZ) power of 20 W is also applied to the substrate side (sample stage) to apply a substantially negative self-bias voltage. Under the second etching conditions in which $CF_4$ and $Cl_2$ are mixed, both the W film and the TaN film are etched at the same level. With the second etching. conditions, an etching rate to W is 58.97 nm/min. and an etching rate to TaN is 66.43 nm/min. Note that an etching time may be increased by 10 to 20% in order to conduct etching without remaining residue on the gate insulating film.

In the first etching process as described above, the shape of the mask made of resist is made appropriate, whereby the end portion of the first conductive layer and the end portion of the second conductive layer each have a tapered shape due to the effect of the bias voltage applied to the substrate side. The angle of the tapered portion is sufficiently set to 15 to 45°.

Thus, first shape conductive layers 117 to 121 composed of the first conductive layer and the second conductive layer (first conductive layers 117a to 121a and second conductive layers 117b to 121b) are formed by the first etching process. The insulating film 107 that becomes the gate insulating film is etched by approximately 10 to 20 nm, and becomes a gate insulating film 116 in which regions which are not covered by the first shape conductive layers 117 to 121 are thinned.

Next, a second etching process is conducted without removing the masks made of resist. Here, $SF_6$, $Cl_2$ and $O_2$ are used as etching gases. the flow rate of the gases is set to 24/12/24 sccm, and RF (13.56 MHZ) power of 700 W is applied to a coil-shape electrode with a pressure of 1.3 Pa to generate plasma. thereby performing etching for 25 seconds. RF (13.56 MHZ) power of 10 W is also applied to the substrate side (sample stage) to apply a substantially negative self-bias voltage. In the second etching process, an etching rate to W is 227.3 nm/min. an etching rate to TaN is 32.1 nm/min, a selection ratio of W to TaN is 7.1, an etching rate to SiON that is the insulating film 116 is 33.7 nm/min, and a selection ratio of W to SiON is 6.83. In the case where $SF_6$ is used as the etching gas, the selection ratio with respect to the insulating film 116 is high as described above. Thus, reduction in the film thickness can be suppressed. In this embodiment, the film thickness of the insulating film 116 is reduced by only about 8 nm.

By the second etching process, the taper angle of W becomes 70°. By the second etching process, second conductive layers 124b to 129b are formed. On the other hand, the first conductive layers are hardly etched to become first conductive layers 124a to 129a (FIG. 6C). Note that the first conductive layers 124a to 129a have substantially the same size as the first conductive layers 117a to 122a. In actuality, the width of the first conductive layer may be reduced by approximately 0.3 μm, namely, approximately 0.6 μm in the total line width in comparison with before the second etching process. However, there is almost no change in size of the first conductive layer.

Next, the masks made of resist are removed, and then, a first doping process is conducted to obtain the state of FIG. 6D. The doping process may be conducted by ion doping or ion implantation. Ion doping is conducted with the conditions of a dosage of $1.5 \times 10^{14}$ atoms/cm² and an accelerating voltage of 60 to 100 keV. As an impurity element imparting n-type conductivity, phosphorous (P) or arsenic (As) is typically used. In this case, first conductive layers and second conductive layers 124 to 128 become masks against the impurity element imparting n-type conductivity, and first impurity regions 130 to 134 are formed in a self-aligning manner. The impurity element imparting n-type conductivity is added to the first impurity regions 130 to 134 in a concentration range of $1 \times 10^{16}$ to $1 \times 10^{17}$/cm³. Here, the region having the same concentration range as the first impurity region is also called an n⁻ region.

Note that although the first doping process is performed after the removal of the masks made of resist in this embodiment, the first doping process may be performed without removing the masks made of resist.

Subsequently, as shown in FIG. 7A, masks 135 to 137 made of resist are formed, and a second doping process is conducted. The mask 135 is a mask for protecting a channel forming region and a periphery thereof of a semiconductor layer forming a p-channel TFT of a driver circuit, the mask 136 is a mask for protecting a channel forming region and a periphery thereof of a semiconductor layer forming one of n-channel TFTs of the driver circuit, and the mask 137 is a mask for protecting a channel forming region, a periphery thereof, and a storage capacitor of a semiconductor layer forming a TFT of a pixel portion.

With the ion doping conditions in the second doping process: a dosage of $1.5 \times 10^{15}$ atoms/cm²; and an accelerating voltage of 60 to 100 keV, phosphorous (P) is doped. Here, impurity regions are formed in the respective semiconductor layers in a self-aligning manner with the second conductive layers 124b to 126b as masks. Of course, phosphorous is not added to the regions covered by the masks 135 to 137. Thus, second impurity regions 138 to 140 and a third impurity region 142 are formed. The impurity element imparting n-type conductivity is added to the second impurity regions 138 to 140 in a concentration range of $1 \times 10^{20}$ to $1 \times 10^{21}$/cm³. Here, the region having the same concentration range as the second impurity region is also called an n⁺ region.

Further, the third impurity region is formed at a lower concentration than that in the second impurity region by the first conductive layer. and is added with the impurity element imparting n-type conductivity in a concentration range of $1 \times 10^{18}$ to $1 \times 10^{19}$/cm³. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an ⁻ region. Furthermore, the regions covered by the masks 136 and 137 are not added with the impurity element in the second doping process, and become first impurity regions 144 and 145.

Next, after the masks 135 to 137 made of resist are removed, masks 146 to 148 made of resist are newly formed, and a third doping process is conducted as shown in FIG. 7B.

In the driver circuit, by the third doping process as described above, fourth impurity regions 149, 150 and fifth impurity regions 151, 152 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 149 and 150 in a concentration range of $1 \times 10^{20}$ to $1 \times 10^{21}$/cm³. Note that, in the fourth impurity regions 149, 150, phosphorous (P) has been added in the preceding step (n⁻ region), but the impurity element imparting p-type conductivity is added at a concentration that is 1.5 to 3 times as high as that of phosphorous. Thus, the fourth impurity regions 149, 150 have a p-type conductivity. Here, the region having the same concentration range as the fourth impurity region is also called a p⁺ region.

Further, fifth impurity regions 151 and 152 are formed in regions overlapping the tapered portion of the second conductive layer 125a, and are added with the impurity element imparting p-type conductivity in a concentration range of $1 \times 10^{18}$ to $1 \times 10^{20}$/cm³. Here, the region having the same concentration range as the fifth impurity region is also called a p⁻ region.

Through the above-described steps, the impurity regions having n-type or p-type conductivity are formed in the respective semiconductor layers. The conductive layers 124 to 127 become gate electrodes of a TFT. Further, the conductive layer 128 becomes one of electrodes, which forms the storage capacitor in the pixel portion. Moreover, the conductive layer 129 forms a source wiring in the pixel portion.

Next, an insulating film (not shown) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film 153 is formed of a silicon nitride film, and heat treatment (300 to 550° C. for 1 to 12 hours) is performed, thereby conducting a step of hydrogenating the semiconductor layers (FIG. 7C). This step is a step of terminating dangling bonds of the semiconductor layers by hydrogen contained in the first interlayer insulating film 153. The semiconductor layers can be hydrogenated irrespective of the existence of an insulating film (not shown) formed of a silicon oxide film. Incidentally, in this embodiment, a material containing aluminum as its main constituent is used for the second conductive layer, and thus, it is important to apply the heating process condition that the second conductive layer can withstand in the step of hydrogenation. As another means for hydrogenation, plasma hydrogenation (using hydrogen excited by plasma) may be conducted.

Next, a second interlayer insulating film 154 is formed from an organic insulating material on the first interlayer insulating film 153. In this embodiment, an acrylic resin film with a thickness of 1.6 μm is formed. Then, a contact hole that reaches the source wiring 129, contact holes that respectively reach the conductive layers 127 and 128, and contact holes that reach the respective impurity regions are formed. In this embodiment, a plurality of etching processes are sequentially performed. In this embodiment, the second interlayer insulting film is etched with the first interlayer insulating film as the etching stopper, the first interlayer insulating film is etched with the insulating film (not shown) as the etching stopper, and then, the insulating film (not shown) is etched.

Thereafter, wirings and pixel electrode are formed by using Al, Ti, Mo, W and the like. As the material of the electrodes and pixel electrode, it is desirable to use a material excellent in reflecting property, such as a film containing Al or Ag as its main constituent or a lamination film of the above film. Thus, source electrodes or drain electrodes 155 to 160, a gate wiring 162, a connection wiring 161, and a pixel electrode 163 are formed.

Figure 8:
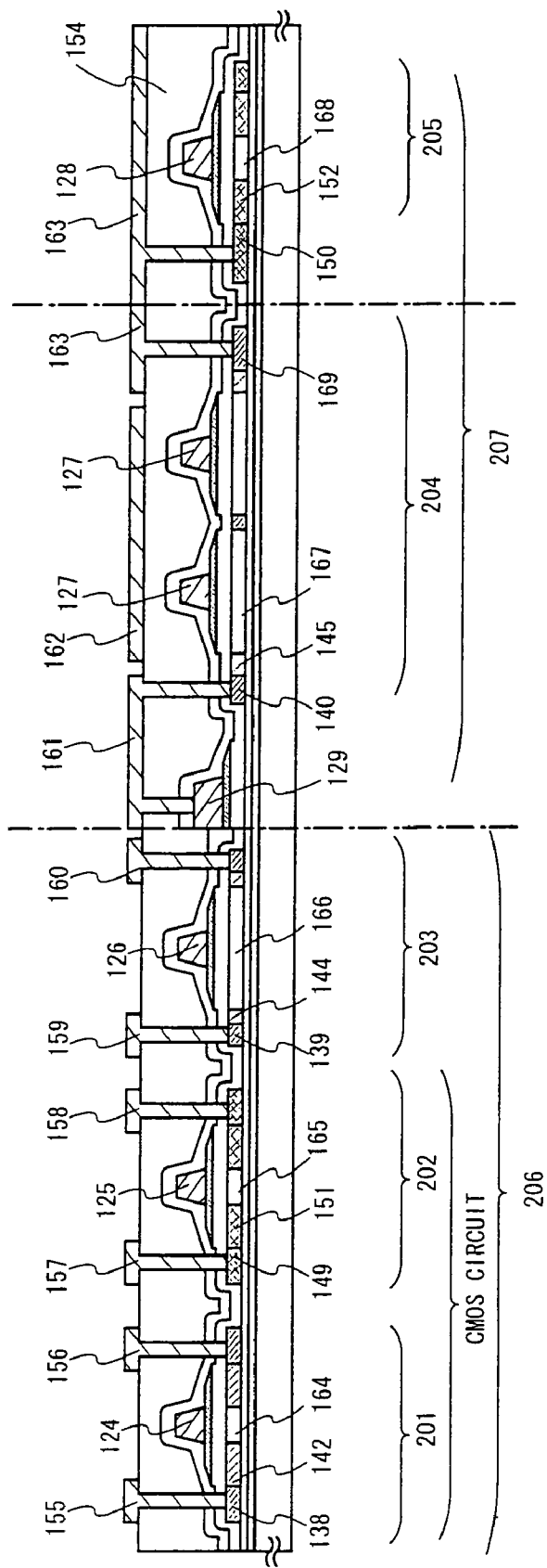
FIG. 8 is a view showing the active matrix substrate (Embodiment 2)

As described above, a driver circuit 206 having an n-channel TFT 201, a p-channel TFT 202, and an n-channel TFT 203 and a pixel portion 207 having a pixel TFT 204 comprised of an n-channel TFT and a storage capacitor 205 can be formed on the same substrate (FIG. 8). In this specification, the above substrate is called an active matrix substrate for the sake of convenience.

In the pixel portion 207, the pixel TFT 204 (n-channel TFT) has a channel forming region 167, the first impurity region (n⁻ region) 145 formed outside the conductive layer 127 forming the gate electrode, and the second impurity region (n⁺ region) 140 functioning as a source region. Further, in the semiconductor layer functioning as one of the electrodes of the storage capacitor 205, the fourth impurity region 150 and the fifth impurity region 152 are formed. The storage capacitor 205 is constituted of the second electrode 128 and the semiconductor layers 150, 152, and 168 with the insulating film (the same film as the gate insulating film) 116 as dielectric.

Further, in the driver circuit 206, the n-channel TFT 201 (first n-channel TFT) has a channel forming region 164, the third impurity region (n⁻ region) 142 that overlaps a part of the conductive layer 124 forming the gate electrode through the insulating film, and the second impurity region (n⁺ region) 138 functioning as a source region or a drain region.

Further, in the driver circuit 206, the p-channel TFT 202 has a channel forming region 165, the fifth impurity region (p⁻ region) 151 that overlaps a part of the conductive layer 125 forming the gate electrode through the insulating film, and the fourth impurity region (p⁺ region) 149 functioning as a source region or a drain region.

Furthermore, in the driver circuit 206, the n-channel TFT 203 (second n-channel TFT) has a channel forming region 166, the first impurity region (n⁻ region) 144 outside the conductive layer 126 forming the gate electrode, and the second impurity region (n⁺ region) 139 functioning as a source region or a drain region.

The above TFTs 201 to 203 are appropriately combined to form a shift resister circuit, a buffer circuit, a level shifter circuit, a latch circuit and the like, thereby forming the driver circuit 206. For example, in the case where a CMOS circuit is formed, the n-channel TFT 201 and the p-channel TFT 202 may be complementarily connected to each other.

In particular, the structure of the n-channel TFT 203 is appropriate for the buffer circuit having a high driving voltage with the purpose of preventing deterioration due to a hot carrier effect.

Moreover, the structure of the n-channel TFT 201, which is a GOLD structure, is appropriate for the circuit in which the reliability takes top priority.

A semiconductor film that is high in levelness and in orientation rate of crystal obtained by the present embodiment is formed for use in an active layer of TFT, whereby withstand pressure and reliability of TFT are increased.

Further, an example of manufacturing the active matrix substrate for forming a reflection type display device is shown in this embodiment. However, if the pixel electrode is formed of a transparent conductive film, a transmission type display device can be formed although the number of photomasks is increased by one.

Furthermore, this embodiment can be freely combined with any of Embodiment Modes and Embodiment 1.

Embodiment 3

This embodiment describes a process of manufacturing an active matrix liquid crystal display device from the active matrix substrate fabricated in Embodiment 2. The description is given with reference to FIG. 9.

After the active matrix substrate as illustrated in FIG. 8 is obtained in accordance with Embodiment 2, an oriented film is formed on the active matrix substrate of FIG. 8 and subjected to rubbing treatment. In this embodiment, before the oriented film is formed, an organic resin film such as an acrylic resin film is patterned to form columnar spacers in desired positions in order to keep the substrates apart. The columnar spacers may be replaced by spherical spacers sprayed onto the entire surface of the substrate.

An opposite substrate is prepared next. The opposite substrate has a color filter in which colored layers and light-shielding layers are arranged with respect to the pixels. A light-shielding layer is also placed in the driving circuit portion. A planarization film is formed to cover the color filter and the light-shielding layer. On the planarization film, an opposite electrode is formed from a transparent conductive film in the pixel portion. An oriented film is formed over the entire surface of the opposite substrate and is subjected to rubbing treatment.

Then the opposite substrate is bonded to the active matrix substrate on which the pixel portion and the driving circuits are formed, using a sealing member. The sealing member has filler mixed therein and the filler, together with the columnar spacers, keeps the distance between the two substrates while they are bonded. Thereafter a liquid crystal material is injected between the substrates and an encapsulant (not shown) is used to completely seal the substrates. A known liquid crystal material can be used. The active matrix liquid crystal display device is thus completed. If necessary, the active matrix substrate or the opposite substrate is cut into pieces of desired shapes. The display device may be appropriately provided with a polarizing plate using a known technique. Then FPCs are attached to the substrate using a known technique.

Figure 9:
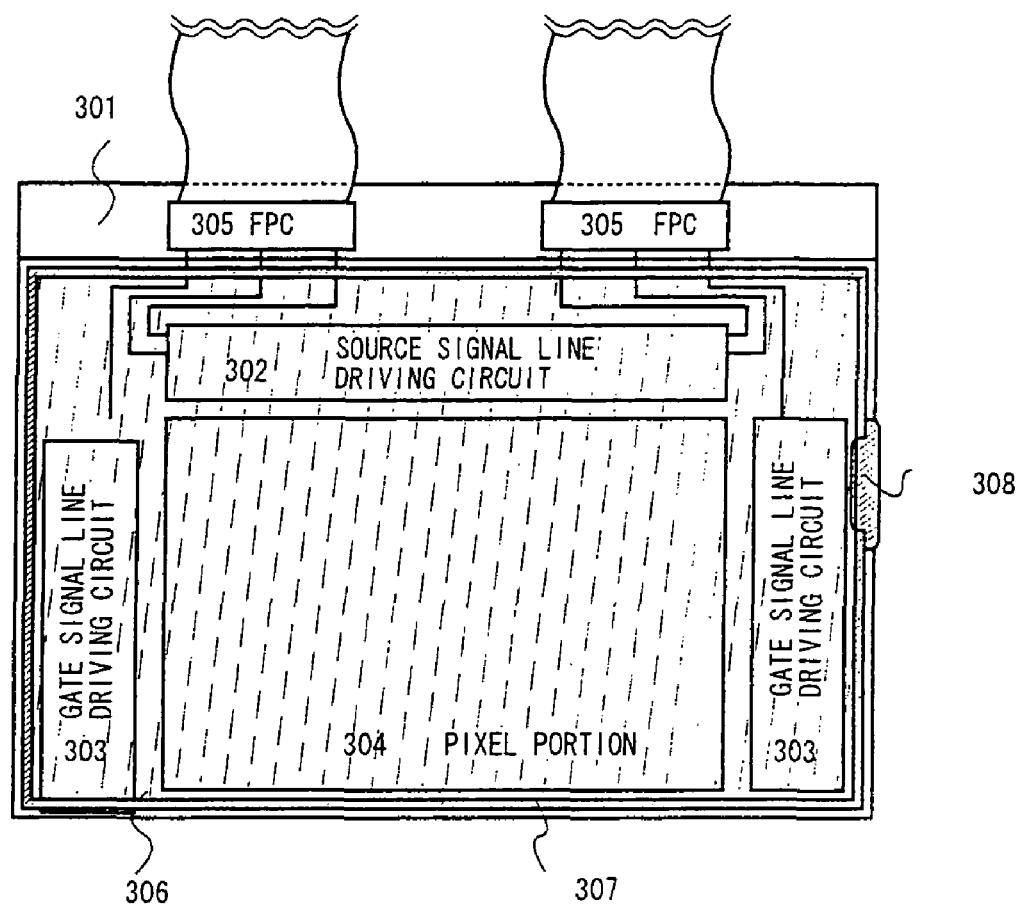
FIG. 9 is an external view of an AM-LCD (Embodiment 3)

The structure of the thus obtained liquid crystal module is described with reference to the top view in FIG. 9.

A pixel portion 304 is placed in the center of an active matrix substrate 301. A source signal line driving circuit 302 for driving source signal lines is positioned above the pixel portion 304. Gate signal line driving circuits 303 for driving gate signal lines are placed to the left and right of the pixel portion 304. Although the gate signal line driving circuits 303 are symmetrical with respect to the pixel portion in this embodiment, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 9 is preferred in terms of circuit operation reliability driving efficiency, and the like.

Signals are inputted to the driving circuits from flexible printed circuits (FPC) 305. The FPCs 305 are press-fit through an anisotropic conductive film or the like after opening contact holes in the interlayer insulating film and resin film and forming a connection electrode 309 so as to reach the wiring lines arranged in given places of the substrate 301. The connection electrode is formed from ITO in this embodiment.

A sealing agent 307 is applied to the substrate along its perimeter surrounding the driving circuits and the pixel portion. An opposite substrate 306 is bonded to the substrate 301 by the sealing agent 307 while a spacer formed in advance on the active matrix substrate keeps the distance between the two substrates constant (the distance between the substrate 301 and the opposed substrate 306). A liquid crystal element is injected through an area of the substrate that is not coated with the sealing agent 307. The substrates are then sealed by an encapsulant 308. The liquid crystal module is completed through the above steps.

Although all of the driving circuits are formed on the substrate in the example shown here, several ICs may be used for some of the driving circuits.

Further, this embodiment can be freely combined with any structures in Embodiment Modes, Embodiment 1 and Embodiment 2.

Embodiment 4

Embodiment 2 shows an example of reflective display device in which a pixel electrode is formed from a reflective metal material. Shown in this embodiment is an example of transmissive display device in which a pixel electrode is formed from a light-transmitting conductive film.

The manufacture process up through the step of forming an interlayer insulating film is identical with the process of Embodiment 2, and the description thereof is omitted here. After the interlayer insulating film is formed in accordance with Embodiment 2, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driving circuits are formed on the substrate in the example shown here, several ICs may be used for some of the driving circuits.

Figure 10:
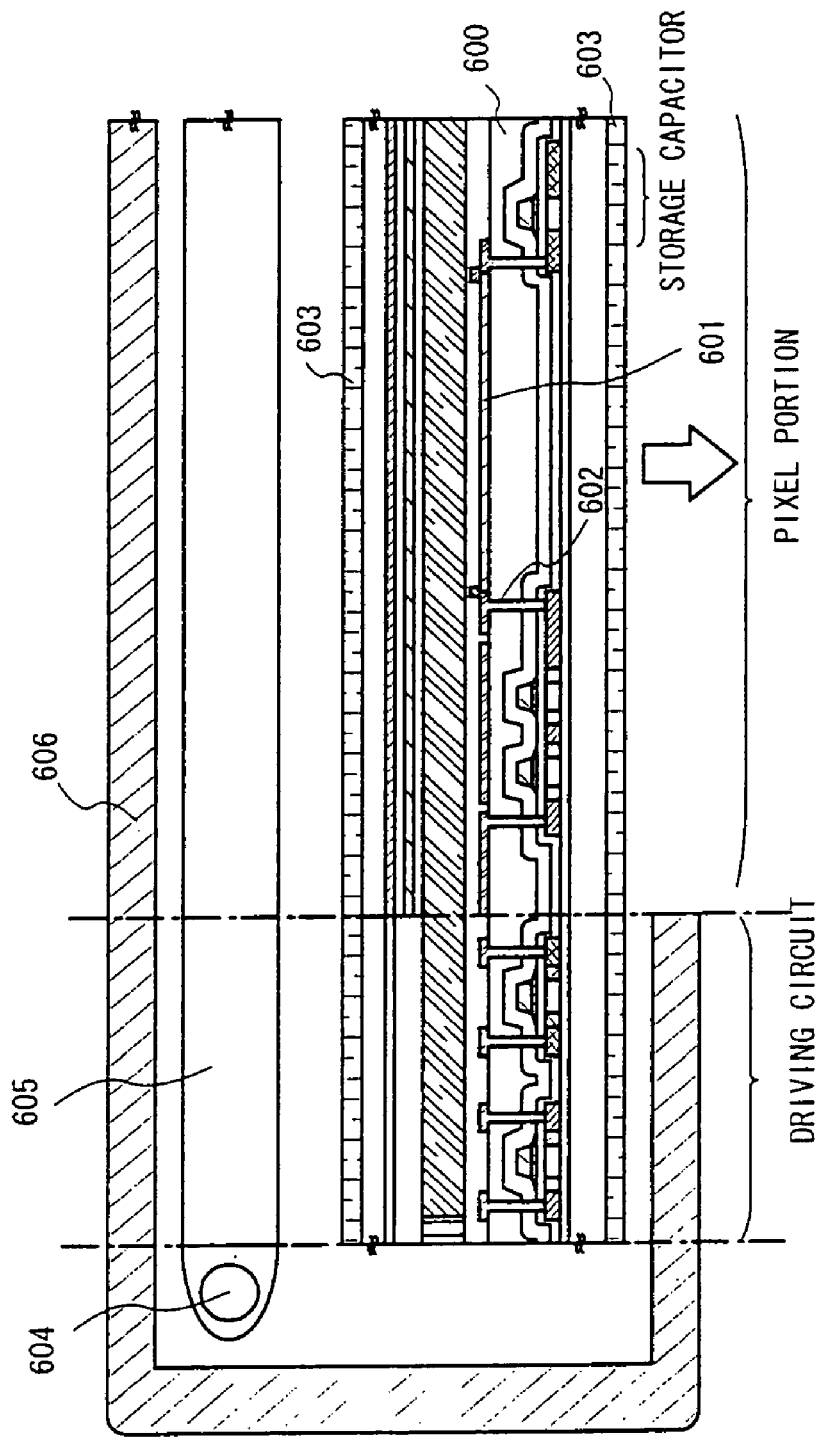
FIG. 10 shows an example of a liquid crystal display device in section (Embodiment 4)

An active matrix substrate is completed as above. A liquid crystal module is manufactured from this active matrix substrate in accordance with Embodiment 3. The liquid crystal module is provided with a backlight 604 and a light guiding plate 605, and is covered with a cover 606 to complete the active matrix liquid crystal display device of which a partial sectional view is shown in FIG. 10. The cover is bonded to the liquid crystal module using an adhesive or an organic resin. When bonding the substrate to the opposite substrate, the substrates may be framed so that the space between the frame and the substrates is filled with an organic resin for bonding. Since the display device is of transmissive type, the active matrix substrate and the opposite substrate each needs a polarizing plate 603 to be bonded.

This embodiment can be freely combined with any structures in Embodiment Modes, and Embodiments 1 to 3.

Embodiment 5

Figure 11A:
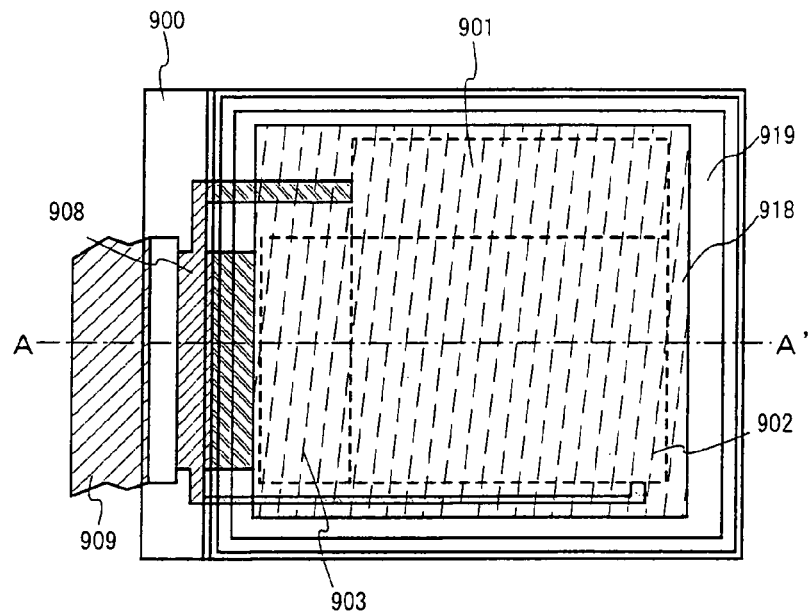
FIGS. 11A and 11B are respectively a top view of an EL module and a sectional view thereof (Embodiment 5)
Figure 11B:
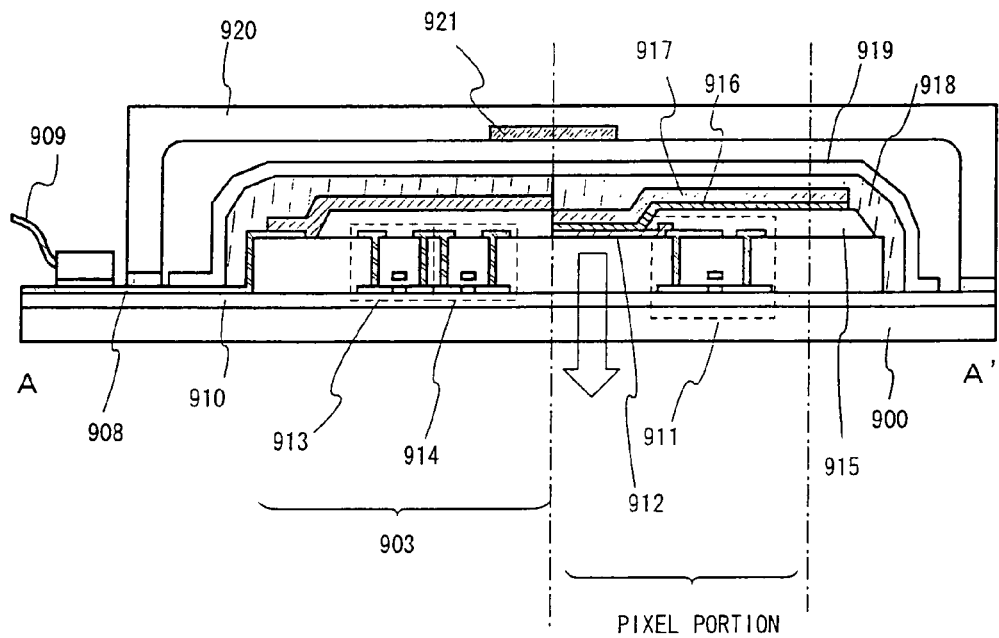

In this embodiment, an example of manufacturing a light emitting, display device provided with an EL (electro luminescence) element is shown in FIGS. 11A and 11B.

FIG. 11A is a top view of an EL module, and FIG. 11B is a sectional view taken along a line A-A' of FIG. 11A. On a substrate 900 having an insulating surface (for example, a glass substrate, a crystallized glass substrate, a plastic substrate or the like), a pixel portion 902, a source side driver circuit 901, and a gate side driver circuit 903 are formed. The pixel portion and the driver circuits can be obtained in accordance with the above-described embodiments. Further, reference numeral 918 indicates a sealing member, and reference numeral 919 indicates a DLC film. The pixel portion and the driver circuit portions are covered by the sealing member 918, and the sealing member is covered by a protective film 919. Further, the protective film 919 is sealed by a cover member 920 using an adhesive. It is desirable that the cover member 920 is made of the same material as the substrate 900, for example, is a glass substrate in order to withstand deformation due to heat or external force. The cover member 920 is processed to have the recess shape (with a depth of 3 to 10 μm) shown in FIG. 11B by sandblasting or the like. It is desirable that the cover member 920 is further processed to form a recess portion (with a depth of 50 to 200 μm) into which a drying agent 921 can be arranged. Further, in the case where multiple EL modules are manufactured, after the substrate and the cover member are attached with each other, segmentation may be conducted using a CO, laser or the like such that end surfaces match with each other.

Note that reference numeral 908 indicates a wiring for transmitting signals input to the source side driver circuit 901 and the gate side driver circuit 903, and receives a video signal and a clock signal from an FPC (flexible printed circuit) 909 that is an external input terminal. Note that although only the FPC is shown in the figure, a printed wiring board (PWB) may be attached to the FPC. The light emitting device in this specification includes not only the main body of the light emitting device but also the light emitting device attached with the FPC or PWB.

Next, the sectional structure is described with reference to FIG. 11B. An insulating film 910 is provided on the substrate 900, the pixel portion 902 and the gate side driver circuit 903 are formed above the insulating film 910, and the pixel portion 902 is constituted of a plurality of pixels including a current control TFT 911 and a pixel electrode 912 electrically connected to a drain of the current control TFT 911. Further, the gate side driver circuit 903 is formed by using a CMOS circuit in which an n-channel TFT 913 and a p-channel TFT 914 are combined.

The above TFTs (including 911, 913, and 914) may be manufactured in accordance with the n-channel TFT 201 and the p-channel TFT 202 in Embodiment 2.

Note that, as to a material of the insulating film provided between the TFT and the EL element, it is appropriate to use a material that not only blocks diffusion of impurity ions such as alkali metal ions or alkaline-earth metal ions but also positively adsorbs the impurity ions such as alkali metal ions or alkaline-earth metal ions, and further to use a material that can withstand a subsequent process temperature. As the material that satisfies the above conditions, a silicon nitride film containing a large amount of fluorine is given as an example. The concentration of fluorine contained in the silicon nitride film is $1\times10^{19}/cm^3$ or more, and preferably, the composition ratio of fluorine in the silicon nitride film is 1 to 5%. Fluorine in the silicon nitride film bonds to alkali metal ions or alkaline-earth metal ions, and is adsorbed into the film. Further, as another example, there is given an organic resin film containing particulates comprised of a stibium (Sb) compound, a stannum (Sn) compound or an indium (In) compound, which adsorbs alkali metal ions, alkaline-earth metal ions or the like, for example, an organic resin film containing particulates of stibium pentoxide ($Sb_2O_5 \cdot nH_2O$). Note that this organic resin film contains particulates with an average particle size of 10 to 20 nm, and has high light transmission properties. The stibium compound typified by the stibium pentoxide particulates is likely to adsorb impurity ions such as alkali metal ions or alkaline-earth metal ions.

The pixel electrode 912 functions as an anode of a light emitting element (EL element). Further, banks 915 are formed at both ends of the pixel electrode 912, and an EL layer 916 and a cathode 917 of the light emitting element are formed on the pixel electrode 912.

As to the EL layer 916, a light emitting layer, a charge transportation layer and a charge injection layer may be freely combined to form an EL layer (layer for light emission and movement of carrier for light emission). For example, a low molecular weight organic EL material or a high molecular weight organic EL material may be used. Further, as the EL layer, a thin film formed from a light emitting material that emits light by singlet excitation (fluorescence) (singlet compound) or a thin film formed from a light emitting material that emits light by triplet excitation (phosphorescence) (triplet compound) can be used. Further, an inorganic material such as silicon carbide can be used for the charge transportation layer or the charge injection layer. Known materials can be used for the organic EL materials or inorganic materials.

A cathode 917 also functions as a wiring common to all the pixels, and is electrically connected to the FPC 909 through the connection wiring 908. Further, all the elements contained in the pixel portion 902 and the gate side driver circuit 903 are covered by the cathode 917, the sealing member 918 and the protective film 919.

Note that a material that is transparent or semitransparent to visible light is preferably used for the sealing member 918. Further, the sealing member 918 is desirably formed from a material that does not permeate moisture or oxygen as much as possible.

Further, after the light emitting element is completely covered by the sealing member 918, it is preferable that the protective film 919 comprised of a DLC film or the like is provided at least on the surface (exposed surface) of the sealing member 918 as shown in FIGS. 11A and 11B. Further, the protective film may be provided on the entire surface including the back surface of the substrate. Here, it is necessary that attention is paid to in order that the protective film is not deposited to the portion where the external input terminal (FPC) is provided. A mask may be used in order not to form the protective film. Alternatively, the external input terminal portion may be covered by a tape formed of Teflon (registered trademark) or the like, which is used as a masking tape in a CVD apparatus in order not to form the protective film.

The light emitting element is sealed by the sealing member 918 and the protective film with the above-described structure, whereby the light emitting element can be completely shut from the outside. Thus, it is possible to prevent a substance that promotes deterioration due to oxidization of the EL layer, such as moisture or oxygen from permeating from the outside. Therefore, the light emitting device with high reliability can be obtained.

Further, the structure may be adopted in which a pixel electrode is a cathode, and an EL layer and an anode are laminated to thereby provide light emission in an opposite direction to that in FIGS. 11A and 11B.

Note that this embodiment can be freely combined with any of Embodiment Modes and Embodiment 1.

Embodiment 6

The driver circuit and the pixel portion formed by implementing the present invention can be used in various modules (active matrix type liquid crystal module, active matrix type EL module and active matrix type EC module). That is, the present invention can be implemented in all of electronic equipments integrated with the modules at display portions thereof.

As such electronic equipment, there are pointed out a video camera, a digital camera, a head mount display (goggle type display), a car navigation system, a projector, a car stereo, a personal computer, a portable information terminal (mobile computer, cellular phone or electronic book) and the like. Examples of these are shown in FIGS. 12 to 14.

FIG. 12A shows a personal computer including a main body 2001, an image input portion 2002, a display portion 2003 and a keyboard 2004. The present invention can be applied to the display portion 2003.

FIG. 12B shows a video camera including a main body 2101, a display portion 2102, a voice input portion 2103, operation switches 2104, a battery 2105 and an image receiving portion 2106. The present invention can be applied to the display portion 2102.

FIG. 12C shows a mobile computer including a main body 2201, a camera portion 2202, an image receiving portion 2203, an operation switch 2204 and a display portion 2205. The present invention can be applied to the display portion 2205.

FIG. 12D shows a goggle type display including a main body 2301, a display portion 2302 and an arm portion 2303. The present invention can be applied to the display portion 2302.

FIG. 12E shows a player using a record medium recorded with programs (hereinafter, referred to as record medium) including a main body 2401, a display portion 2402, a speaker portion 2403, a record medium 2404 and an operation switch 2405. The player uses DVD (Digital Versatile Disc) or CD as the record medium and can enjoy music, enjoy movie and carry out game or Internet. The present invention can be applied to the display portion 2402.

FIG. 12F shows a digital camera including a main body 2501, a display portion 2502, an eye contact portion 2503, operation switches 2504 and an image receiving portion (not illustrated). The present invention can be applied to the display portion 2502.

FIG. 13A shows a front type projector including a projection equipment 2601 and a screen 2602. The present invention can be applied to the liquid crystal module 2808 forming a part of the projection equipment 2601.

FIG. 13B shows a rear type projector including a main body 2701, a projection equipment 2702, a mirror 2703 and a screen 2704. The present invention can be applied to the liquid crystal module 2808 forming a part of the projection equipment 2702.

Further, FIG. 13C is a view showing an example of a structure of the projection equipment 2601 and 2702 in FIG. 13A and FIG. 13B. The projection equipment 2601 or 2702 is constituted by a light source optical system 2801, mirrors 2802, and 2804 through 2806, a dichroic mirror 2803, a prism 2807, a liquid crystal display equipment 2808, a phase difference plate 2809 and a projection optical system 2810. The projection optical system 2810 is constituted by an optical system including a projection lens. Although this embodiment shows an example of three plates type, this embodiment is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 13C.

Further, FIG. 13D is a view showing an example of a structure of the light source optical system 2801 in FIG. 13C. According to this embodiment, the light source optical system 2801 is constituted by a reflector 2811, a light source 2812, lens arrays 2813 and 2814, a polarization conversion element 2815 and a focusing lens 2816. Further, the light source optical system shown in FIG. 13D is only an example and this example is not particularly limited thereto. For example, a person of executing this embodiment may pertinently provide an optical system such as an optical lens, a film having a polarization function, a film for adjusting a phase difference or an IR film in the light source optical system.

However, according to the projectors shown in FIG. 13, there is shown a case of using a transmission type electro-optical device and an example of applying a reflection type electro-optical device and EL module are not illustrated.

Figure 14A:
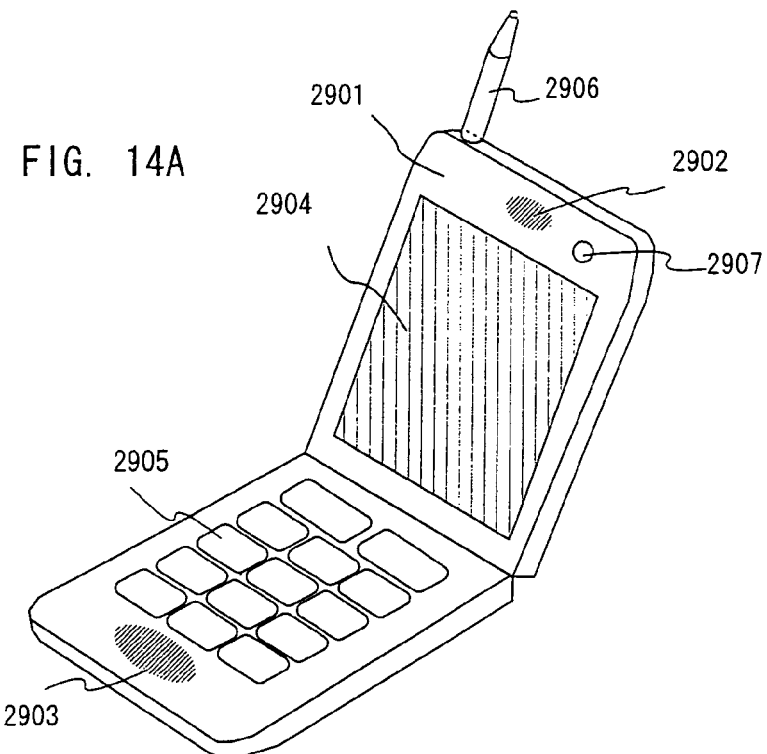
FIGS. 14A to 14C each show an example of the electronic equipment (Embodiment 6)

FIG. 14A shows a cellular phone including a main body 2901, a sound output portion 2902, a sound input portion 2903, a display portion 2904, an operation switch 2905, an antenna 2906 and an image input portion (CCD, image sensor or the like) 2907. The present invention can be applied to display portion 2904.

Figure 14B:
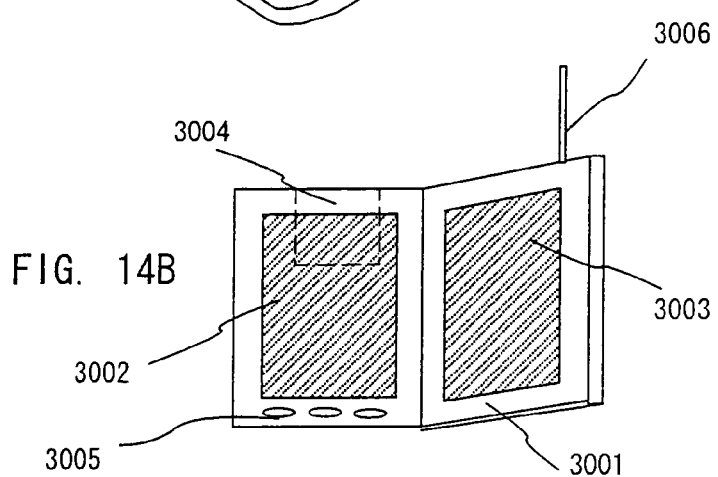

FIG. 14B shows a portable book (electronic book) including a main body 3001, display portions 3002 and 3003, a record medium 3004, an operation switch 3005 and an antenna 3006. The present invention can be applied to display portions 3002 and 3003.

Figure 14C:
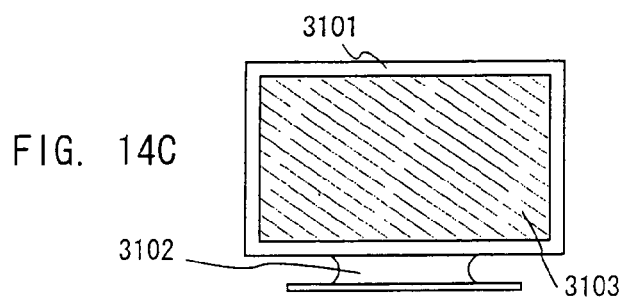

FIG. 14C shows a display including a main body 3101, a support base 3102 and a display portion 3103. The present invention can be applied to display portion 3103.

In addition, the display shown in FIG. 14C is small and medium type or large type, for example, screen of the display sized 5 to 20 inches. Moreover, it is preferable to mass-produce by executing a multiple pattern using a substrate sized 1×1 m to form such sized display section.

As has been described, the range of applying the present invention is extremely wide and is applicable to electronic equipment of all the fields. The electronic equipment of the present invention can be implemented by freely combined with the structures in Embodiments 1 to 5.

According to the present invention, a semiconductor film that is high in levelness and in orientation rate of crystal is formed for use in an active layer of TFT, whereby a semiconductor device which has a low OFF current value with a reduced variation can be obtained.

What is claimed is:

1. A method of manufacturing a semiconductor device, comprising the steps of:
    forming a semiconductor film over an insulating surface, wherein the semiconductor film contains germanium and has an amorphous structure;
    adding a metal element for accelerating crystallization to the semiconductor film having the amorphous structure;
    performing a heat treatment to the semiconductor film having the amorphous structure to form a semiconductor film having a crystalline structure;
    irradiating the semiconductor film having the crystalline structure with a first laser light in an atmosphere or in an oxygen atmosphere;
    irradiating the semiconductor film having the crystalline structure with a second laser light in an inert gas atmosphere or in a vacuum, after irradiating with the first laser light,
    forming a second semiconductor film including a rare gas element over the semiconductor film having the crystalline structure, after irradiating with the second laser light;
    gettering the metal element from the semiconductor film having the crystalline structure into the second semiconductor film; and
    removing the second semiconductor film.

2. A method of manufacturing a semiconductor device according to claim 1, wherein an energy density of the second laser light is higher than that of the first laser light.

3. A method of manufacturing a semiconductor device according to claim 1, wherein the first laser light is one of an excimer laser, a second harmonic to a fourth harmonic of a YAG laser, and a $YVO_4$ laser.

4. A method of manufacturing a semiconductor device according to claim 1, wherein the second laser light is one of an excimer laser, a second harmonic to a fourth harmonic of a YAG laser, and a $YVO_4$ laser.

5. A method of manufacturing a semiconductor device according to claim 1, wherein after irradiating with the second laser light, the semiconductor film having the crystalline structure has a P-V value of less than 70 nm which indicates a surface roughness of an upper main surface thereof.

6. A method of manufacturing a semiconductor device according to claim 1, wherein after irradiating with the second laser light, the semiconductor film having the crystalline structure has a root mean square roughness of less than 10 nm which indicates a surface roughness of an upper main surface thereof.

7. A method of manufacturing a semiconductor device according to claim 1, wherein after irradiating with the second laser light, an orientation ratio with respect to {101} lattice plane of the semiconductor film having the crystalline structure is higher than an orientation ratio with respect to {111} lattice plane thereof.

8. A method of manufacturing a semiconductor device, comprising the steps of:
forming a semiconductor film over an insulating surface, wherein the semiconductor film contains germanium and has an amorphous structure;
adding a metal element for accelerating crystallization to the semiconductor film having the amorphous structure;
performing a heat treatment to the semiconductor film having the amorphous structure to form a semiconductor film having a crystalline structure;
irradiating the semiconductor film having the crystalline structure with a first laser light so that an oxide film is formed on the semiconductor film having the crystalline structure;
removing the oxide film;
irradiating the semiconductor film having the crystalline structure with a second laser light after removing the oxide film;
forming a second semiconductor film including a rare gas element over the semiconductor film having the crystalline structure, after irradiating with the second laser light;
gettering the metal element from the semiconductor film having the crystalline structure into the second semiconductor film; and
removing the second semiconductor film.

9. A method of manufacturing a semiconductor device according to claim 8, wherein an energy density of the second laser light is higher than that of the first laser light.

10. A method of manufacturing a semiconductor device according to claim 8, wherein the first laser light is one of an excimer laser, a second harmonic to a fourth harmonic of a YAG laser, and a YVO$_4$ laser.

11. A method of manufacturing a semiconductor device according to claim 8, wherein the second laser light is one of an excimer laser, a second harmonic to a fourth harmonic of a YAG laser, and a YVO$_4$ laser.

12. A method of manufacturing a semiconductor device according to claim 8, wherein after irradiating with the second laser light, the semiconductor film having the crystalline structure has a P-V value of less than 70 nm which indicates a surface roughness of an upper main surface thereof.

13. A method of manufacturing a semiconductor device according to claim 8, wherein after irradiating with the second laser light, the semiconductor film having the crystalline structure has a root mean square roughness of less than 10 nm which indicates a surface roughness of an upper main surface thereof.

14. A method of manufacturing a semiconductor device according to claim 8, wherein after irradiating with the second laser light, an orientation ratio with respect to {101} lattice plane of the semiconductor film having the crystalline structure is higher than an orientation ratio with respect to {111} lattice plane thereof.

15. A method of manufacturing a semiconductor device according to claim 8, wherein the step of irradiating with the second laser light is performed in an inert gas atmosphere or in a vacuum.

16. A method of manufacturing a semiconductor device, comprising the steps of:
forming a semiconductor film over an insulating surface, wherein the semiconductor film contains germanium and has an amorphous structure;
adding a metal element for accelerating crystallization to the semiconductor film having the amorphous structure;
performing a heat treatment to the semiconductor film having the amorphous structure to form a semiconductor film having a crystalline structure;
irradiating the semiconductor film having the crystalline structure with a first laser light in an atmosphere or in an oxygen atmosphere;
irradiating the semiconductor film having the crystalline structure with a second laser light in an inert gas atmosphere or in a vacuum, after irradiating with the first laser light,
oxidizing a surface of the semiconductor film having the crystalline structure to form an oxide film, after irradiating with the second laser light;
forming a second semiconductor film including a rare gas element on the oxide film;
gettering the metal element from the semiconductor film having the crystalline structure into the second semiconductor film; and
removing the second semiconductor film.

17. A method of manufacturing a semiconductor device according to claim 16, wherein an energy density of the second laser light is higher than that of the first laser light.

18. A method of manufacturing a semiconductor device according to claim 16, wherein the first laser light is one of an excimer laser, a second harmonic to a fourth harmonic of a YAG laser, and a YVO$_4$ laser.

19. A method of manufacturing a semiconductor device according to claim 16, wherein the second laser light is one of an excimer laser, a second harmonic to a fourth harmonic of a YAG laser, and a YVO$_4$ laser.

20. A method of manufacturing a semiconductor device according to claim 16, wherein after irradiating with the second laser light, the semiconductor film having the crystalline structure has a P-V value of less than 70 nm which indicates a surface roughness of an upper main surface thereof.

21. A method of manufacturing a semiconductor device according to claim 16, wherein after irradiating with the second laser light, the semiconductor film having the crystalline structure has a root mean square roughness of less than 10 nm which indicates a surface roughness of an upper main surface thereof.

22. A method of manufacturing a semiconductor device according to claim 16, wherein after irradiating with the second laser light, an orientation ratio with respect to {101} lattice plane of the semiconductor film having the crystalline structure is higher than an orientation ratio with respect to {111} lattice plane thereof.

23. A method of manufacturing a semiconductor device, comprising the steps of:
forming a semiconductor film over an insulating surface, wherein the semiconductor film contains germanium and has an amorphous structure;
adding a metal element for accelerating crystallization to the semiconductor film having the amorphous structure;

performing a heat treatment to the semiconductor film having the amorphous structure to form a semiconductor film having a crystalline structure;

irradiating the semiconductor film having the crystalline structure with a first laser light so that a first oxide film is formed on the semiconductor film having the crystalline structure;

removing the first oxide film;

irradiating the semiconductor film having the crystalline structure with a second laser light after removing the first oxide film;

oxidizing a surface of the semiconductor film having the crystalline structure to form a second oxide film, after irradiating with the second laser light;

forming a second semiconductor film including a rare gas element on the second oxide film;

gettering the metal element from the semiconductor film having the crystalline structure into the second semiconductor film; and removing the second semiconductor film.

24. A method of manufacturing a semiconductor device according to claim 23, wherein an energy density of the second laser light is higher than that of the first laser light.

25. A method of manufacturing a semiconductor device according to claim 23, wherein the first laser light is one of an excimer laser, a second harmonic to a fourth harmonic of a YAG laser, and a $YVO_4$ laser.

26. A method of manufacturing a semiconductor device according to claim 23, wherein the second laser light is one of an excimer laser, a second harmonic to a fourth harmonic of a YAG laser, and a $YVO_4$ laser.

27. A method of manufacturing a semiconductor device according to claim 23, wherein after irradiating with the second laser light, the semiconductor film having the crystalline structure has a P-V value of less than 70 nm which indicates a surface roughness of an upper main, surface thereof.

28. A method of manufacturing a semiconductor device according to claim 23, wherein after irradiating with the second laser light, the semiconductor film having the crystalline structure has a root mean square roughness of less than 10 nm which indicates a surface roughness of an upper main surface thereof.

29. A method of manufacturing a semiconductor device according to claim 23, wherein after irradiating with the second laser light, an orientation ratio with respect to {101} lattice plane of the semiconductor film having the crystalline structure is higher than an orientation ratio with respect to {111} lattice plane thereof.

30. A method of manufacturing a semiconductor device according to claim 23, wherein the step of irradiating with the second laser light is performed in an inert gas atmosphere or in a vacuum.

31. A method of manufacturing a semiconductor device, comprising the steps of:

forming a semiconductor film over an insulating surface, wherein the semiconductor film contains germanium and has an amorphous structure;

adding a metal element for accelerating crystallization to the semiconductor film having the amorphous structure;

performing a heat treatment to the semiconductor film having the amorphous structure to form a semiconductor film having a crystalline structure;

irradiating the semiconductor film having the crystalline structure with a first laser light so that a first oxide film is formed on the semiconductor film having the crystalline structure;

removing the first oxide film;

irradiating the semiconductor film having the crystalline structure with a second laser light after removing the first oxide film;

oxidizing a surface of the semiconductor film having the crystalline structure with a solution containing ozone to form a second oxide film, after irradiating with the second laser light;

forming a second semiconductor film including a rare gas element on the second oxide film;

gettering the metal element from the semiconductor film having the crystalline structure into the second semiconductor film; and removing the second semiconductor film.

32. A method of manufacturing a semiconductor device according to claim 31, wherein an energy density of the second laser light is higher than that of the first laser light.

33. A method of manufacturing a semiconductor device according to claim 31, wherein the first laser light is one of an excimer laser, a second harmonic to a fourth harmonic of a YAG laser, and a $YVO_4$ laser.

34. A method of manufacturing a semiconductor device according to claim 31, wherein the second laser light is one of an excimer laser, a second harmonic to a fourth harmonic of a YAG laser, and a $YVO_4$ laser.

35. A method of manufacturing a semiconductor device according to claim 31, wherein after irradiating with the second laser light, the semiconductor film having the crystalline structure has a P-V value of less than 70 nm which indicates a surface roughness of an upper main surface thereof.

36. A method of manufacturing a semiconductor device according to claim 31, wherein after irradiating with the second laser light, the semiconductor film having the crystalline structure has a root mean square roughness of less than 10 nm which indicates a surface roughness of an upper main surface thereof.

37. A method of manufacturing a semiconductor device according to claim 31, wherein after irradiating with the second laser light, an orientation ratio with respect to {101} lattice plane of the semiconductor film having the crystalline structure is higher than an orientation ratio with respect to {111} lattice plane thereof.

38. A method of manufacturing a semiconductor device according to claim 31, wherein the step of irradiating with the second laser light is performed in an inert gas atmosphere or in a vacuum.

39. A method of manufacturing a semiconductor device according to claim 31, wherein the step of gettering the metal element is performed by performing a heat treatment to the semiconductor film having the crystalline structure.

* * * * *